(12) United States Patent
Park et al.

(10) Patent No.: US 11,038,003 B2
(45) Date of Patent: Jun. 15, 2021

(54) FOLDABLE DISPLAY APPARATUS

(71) Applicant: Samsung Display Co., Ltd., Yongin-Si (KR)

(72) Inventors: Yonghan Park, Yongin-si (KR); Youngran Son, Yongin-si (KR); Hyunjung Kim, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/809,373

(22) Filed: Mar. 4, 2020

(65) Prior Publication Data

US 2020/0350384 A1 Nov. 5, 2020

(30) Foreign Application Priority Data

May 2, 2019 (KR) .................. 10-2019-0051821

(51) Int. Cl.
*H01L 27/32* (2006.01)
*H01L 51/52* (2006.01)
*H01L 51/00* (2006.01)

(52) U.S. Cl.
CPC ........ *H01L 27/3267* (2013.01); *H01L 27/323* (2013.01); *H01L 51/0097* (2013.01); *H01L 51/5225* (2013.01); *H01L 2251/5338* (2013.01)

(58) Field of Classification Search
CPC .................. H01L 27/3267; H01L 27/323
See application file for complete search history.

(56) References Cited

U.S. PATENT DOCUMENTS

| | | | |
|---|---|---|---|
| 9,915,774 B2 | 3/2018 | Cho et al. | |
| 10,235,119 B2 | 3/2019 | Choi et al. | |
| 10,635,137 B2 * | 4/2020 | Park | G06F 1/1686 |
| 2014/0145161 A1 * | 5/2014 | Naijo | H01L 51/0097 257/40 |
| 2015/0338888 A1 | 11/2015 | Kim et al. | |
| 2017/0023979 A1 * | 1/2017 | Yamazaki | H01L 51/0097 |
| 2019/0196635 A1 | 6/2019 | Park et al. | |
| 2019/0259351 A1 * | 8/2019 | Yoon | H01L 51/0097 |
| 2020/0220101 A1 * | 7/2020 | Moon | H01L 51/5225 |

FOREIGN PATENT DOCUMENTS

| | | |
|---|---|---|
| KR | 10-2016-0089126 A | 7/2016 |
| KR | 10-2017-0085317 A | 7/2017 |
| KR | 10-2018-0027467 A | 3/2018 |
| KR | 10-2018-0049296 A | 5/2018 |
| KR | 10-2018-0050473 A | 5/2018 |

* cited by examiner

*Primary Examiner* — Douglas M Menz

(74) *Attorney, Agent, or Firm* — Innovation Counsel LLP

(57) ABSTRACT

A foldable display apparatus may include a first display panel and a component. The first display panel may include a first section and a second section. The first section may include a first pixel set and a first transmission structure surrounded by the first pixel set. The second section may include a second pixel set, may include a second transmission structure surrounded by the second pixel set, and may rotate relative to the first display section about a folding axis. A distance from the folding axis to a center of the first transmission structure may be substantially equal to a distance from the folding axis to a center of the second transmission structure. The component may overlap the first transmission structure. The second transmission structure may overlap the first transmission structure and the component when the foldable display apparatus is in a folded state.

20 Claims, 24 Drawing Sheets

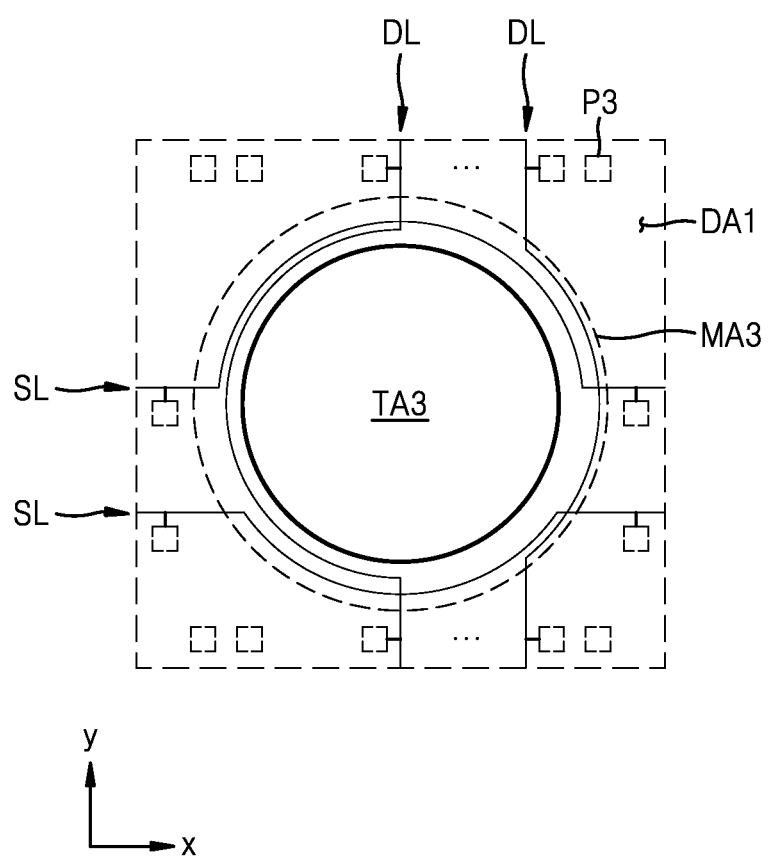

FOLDABLE DISPLAY APPARATUS

CROSS-REFERENCE TO RELATED APPLICATION

This application claims the benefit of Korean Patent Application No. 10-2019-0051821, filed on May 2, 2019, in the Korean Intellectual Property Office; the disclosure of the Korean Patent Application is incorporated herein in its entirety by reference.

BACKGROUND

1. Field

The technical field relates to a foldable display apparatus

2. Description of the Related Art

Display apparatuses have been used for diverse purposes. For serving various purposes, various designs for display apparatuses have been developed.

SUMMARY

One or more embodiments may be related to a foldable display apparatus.

According to one or more embodiments, a foldable display apparatus includes: a first display panel having a display area that is disposed on a surface thereof, the display area being configured to display an image; a case supporting the first display panel; and a component located between the case and the first display panel, wherein the first display panel includes a first transmission area and a second transmission area disposed inside the display area and symmetrically disposed based on a folding axis across the display area, and each of the first transmission area and the second transmission area overlaps the component, when the foldable display apparatus is folded.

A width of the second transmission area may be equal to or greater than a width of the first transmission area.

The foldable display apparatus may further include a second display panel configured to display an image in a different direction from the first display panel.

The second display panel may include a third transmission area overlapping the second transmission area, and a width of the third transmission area may be equal to or greater than the width of the second transmission area.

The second display panel may include a display area configured to display an image and the third transmission area may be located inside the display area of the second display panel.

The foldable display apparatus may further include a circuit portion disposed outside the second display panel and electrically connected to each of the first display panel and the second display panel.

The first display panel may include a first hole and a second hole penetrating the first display panel, the first hole and the second hole being located in the first transmission area and the second transmission area, respectively.

The first display panel may include: a first substrate; a pixel circuit layer disposed on the first substrate and including transistors and storage capacitors located in the display area; a display element layer disposed on the pixel circuit layer and including display elements located in the display area; and a thin film encapsulation layer disposed on the display element layer.

The display element layer may include pixel electrodes corresponding to the display elements, respectively, emission layers corresponding to the pixel electrodes, respectively, and a common electrode on the emission layers.

The common electrode may have holes located in the first transmission area and the second transmission area, respectively.

The component may include a camera, a sensor, a speaker, a microphone, or a small lamp.

According to one or more embodiments, a foldable display apparatus includes: a flexible display panel including a display area and at least one first transmission area and at least one second transmission area each disposed inside the display area; and a component overlapping the first transmission area, wherein, when the foldable display apparatus is folded, the at least one second transmission area overlaps the at least one first transmission area and the component, and light emitted from the component or received by the component passes through the at least one first transmission area and the at least one second transmission area.

A width of the at least one second transmission area may be equal to or greater than a width of the at least one first transmission area.

The flexible display panel may further include a touch electrode layer including touch electrodes, and an optical functional layer.

The foldable display apparatus may further include a second display panel disposed to overlap a portion of the flexible display panel.

The foldable display apparatus may further include a circuit portion disposed outside the second display panel and electrically connected to each of the flexible display panel and the second display panel.

The second display panel may include a display area configured to display an image and at least one third transmission area located inside the display area.

When the foldable display apparatus is unfolded, the at least one third transmission area may overlap the at least one second transmission area. Also, when the foldable display apparatus is folded, the at least one third transmission area may overlap the at least one second transmission area, the at least one first transmission area, and the component.

The at least one first transmission area may include two adjacent first transmission areas and the at least one second transmission area may include two adjacent second transmission areas. Also, the display area of the flexible display panel may include first pixels arranged between the two adjacent first transmission areas and second pixels arranged between the two adjacent second transmission areas.

When the foldable display apparatus is folded, the component may be disposed to overlap the two adjacent first transmission areas, the two adjacent second transmission areas, the first pixels, and the second pixels.

The flexible display panel may have a first hole and a second hole corresponding to the at least one first transmission area and the at least one second transmission area, respectively, and penetrating the flexible display panel.

An embodiment may be related to a foldable display apparatus. The foldable display apparatus may include a first display panel and a component. The first display panel may include a first display section and a second display section. The first display section may include a first pixel set and a first transmission structure surrounded by the first pixel set. The second display section may include a second pixel set, may include a second transmission structure surrounded by the second pixel set, and may rotate relative to the first display section about a folding axis. A distance from the folding axis to a center of the first transmission structure may be substantially equal to a distance from the folding axis to a center of the second transmission structure. The component may overlap the first transmission structure. The second transmission structure may overlap the first transmission structure and the component for transmitting a signal between the component and an entity external to the foldable display apparatus when the foldable display apparatus is in a folded state.

Each of the first transmission structure and the second transmission structure may include no light-emitting elements and may not emit light.

A width of the second transmission structure in a first direction may be equal to or greater than a width of the first transmission structure in the first direction. The first direction may be parallel to a display surface of the first display panel.

The foldable display apparatus may include a second display panel overlapping the first display panel. The first display panel may display a first image in a first display direction. The second display panel may display a second image in a second display direction different from the first display direction.

The second display panel may include a third transmission structure overlapping the second transmission structure. A width of the third transmission structure in the first direction may be equal to or greater than the width of the second transmission structure in the first direction.

The second display panel further may include a third pixel set. The third transmission structure may be surrounded by the third pixel set.

The foldable display apparatus may include a circuit disposed outside the second display panel and electrically connected to each of the first display panel and the second display panel.

The first transmission structure may include a first hole that extends through layers of the first display panel. The second transmission structure may include a second hole that extends through the layers of the first display panel.

The first display panel may include the following elements: a first substrate; a pixel circuit layer disposed on the first substrate and may include transistors and storage capacitors; a display element layer disposed on the pixel circuit layer and may include display elements, wherein some elements of the pixel circuit layer and some elements of the display element layer form the first pixel set and the second pixel set; and a thin film encapsulation layer disposed on the display element layer.

The display element layer may include pixel electrodes corresponding to the display elements, respectively, may include emission layers corresponding to the pixel electrodes, respectively, and may include a common electrode on the emission layers. The common electrode may have a first hole and a second hole located in the first transmission structure and the second transmission structure, respectively.

The component may include at least one of a camera, a sensor, a speaker, a microphone, and a lamp.

The first display panel may be flexible. The first display section may be directly connected to the second display section.

A perimeter of the second transmission structure may surround a perimeter of the first transmission structure in a plan view of the foldable display apparatus when the foldable display apparatus may be in the folded state.

The first display section further may include a touch electrode layer and an optical functional layer. The touch electrode layer may include touch electrode and may be covered by the optical function layer. The first transmission structure may include a hole positioned at one or more of the optical function layer and the touch electrode layer.

The foldable display apparatus may include a second display panel smaller than the first display panel and partially overlapping the first display panel.

The second display section may be positioned closer to the second display panel than the first display section.

The second display panel may include a third pixel set, two third transmission structures surrounded by the third pixel set, and a fourth pixel set positioned between the two third transmission structures. One of the two third transmission structures may overlap the second transmission structure.

When the foldable display apparatus is in the folded state, the one of the two third transmission structures may overlap each of the second transmission structure, the first transmission structure, and the component.

The first transmission structure may include two first transmission sub-structures (e.g., two holes). The first display section may include a third pixel set positioned between the two first transmission sub-structures. The second transmission structure may include two second transmission sub-structures (e.g., two openings). The second display section may include a fourth pixel set positioned between the two second transmission sub-structures.

When the foldable display apparatus is in the folded state, the component overlaps perimeters of the two first transmission sub-structures, perimeters of the two second transmission sub-structures, the third pixel set, and the fourth pixel set.

A minimum distance between the two first transmission sub-structures in the first direction may be greater than a minimum distance between the two second transmission sub-structures in the first direction.

BRIEF DESCRIPTION OF THE DRAWINGS

FIG. 4B is a plan view illustrating an area including a third transmission area of a second display panel according to an embodiment.

DETAILED DESCRIPTION

Figure 1:
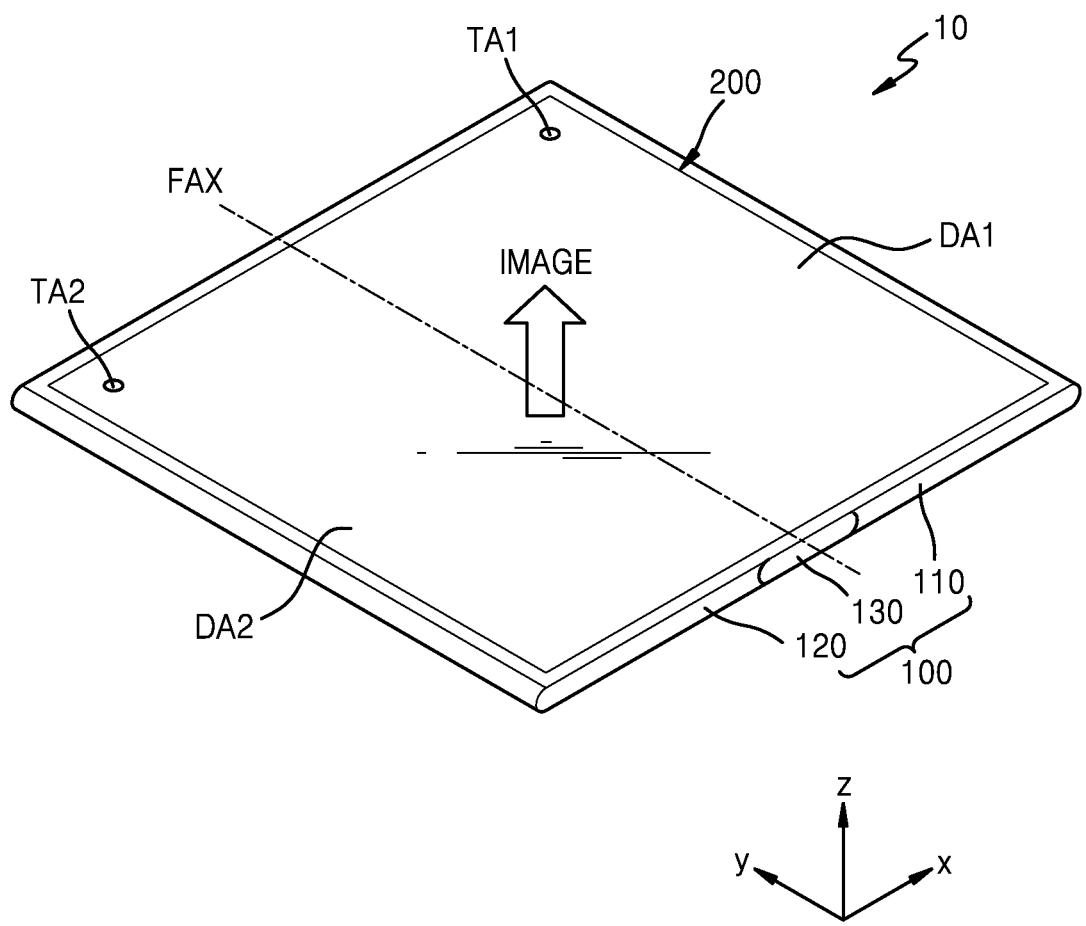
FIG. 1 schematically illustrates a perspective view of a display apparatus according to an embodiment.

Example embodiments are described with reference to the accompanying drawings. Like reference numerals may refer to like elements.

The terms "first," "second," etc. may be used to describe various components; these components should not be limited by these terms. These components are used to distinguish one component from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The singular forms "a," "an," and "the" may include the plural forms as well, unless the context clearly indicates otherwise.

When a first element is referred to as being "on" or "connected to" a second element, the first element can be directly or indirectly on or connected to the second element.

Dimensions of elements in the drawings may be exaggerated for convenience of explanation.

When a certain embodiment may be implemented differently, a specific process order may be performed differently. For example, two consecutively described processes may be performed substantially at the same time or performed in an order opposite to the described order.

In the following examples, the x-axis, the y-axis and the z-axis may or may not be perpendicular to one another.

A display apparatus may display an image. A display apparatus may be a portable mobile apparatus, such as a cellular phone, a game machine, a multimedia apparatus, or a subminiature personal computer (PC). A display apparatus may include a liquid crystal display apparatus, an electrophoretic display apparatus, an organic light-emitting display apparatus, an inorganic light-emitting display apparatus, a field emission display apparatus, a surface-conduction electron-emitter display apparatus, a quantum dot display apparatus, a plasma display apparatus, or a cathode ray display apparatus. Organic light-emitting display apparatuses are described as examples.

A "transmission area" may mean a transmission structure for transmitting one or more signals, such as energy, light, and/or sound. For example, the transmission structure may include at least one hole and/or at least one medium. A hole may mean a through hole, an opening, a recess, or a cavity. A hole may be a substantial vacuum or may contain a medium. A medium, such as air, may be contained in a hole. A list of items (e.g., semi-transparent or transparent materials) may mean at least one of the listed items. That a hole overlaps an object may mean that the space inside the hole or the position of the hole overlaps (the position of) the object.

Figure 2:
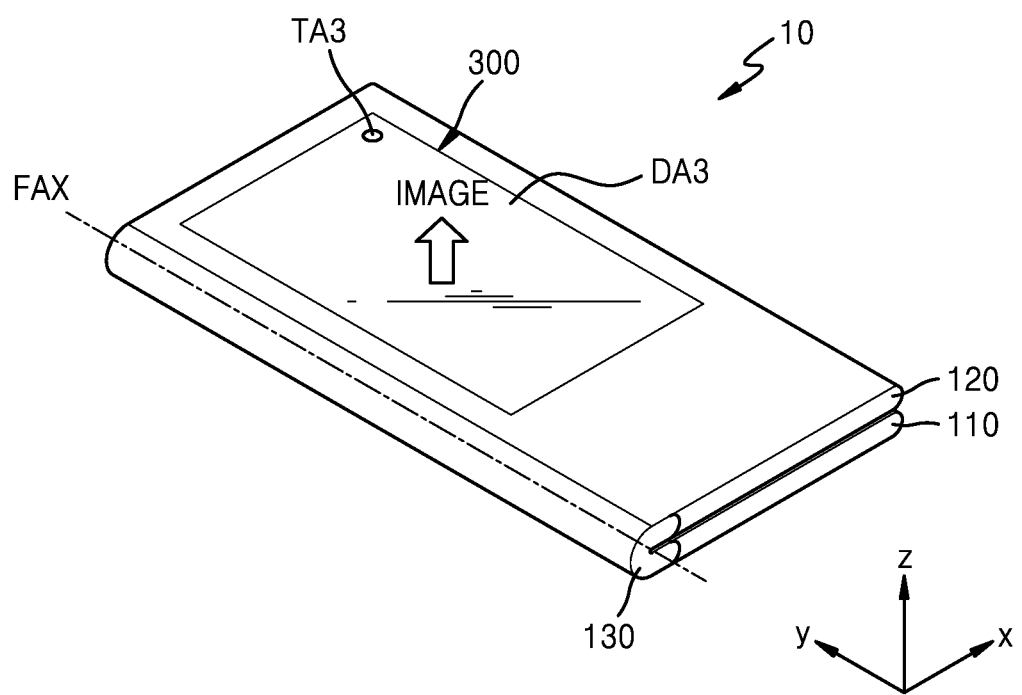
FIG. 2 illustrates a perspective view of a display apparatus in a folded state according to an embodiment.
Figure 3A:
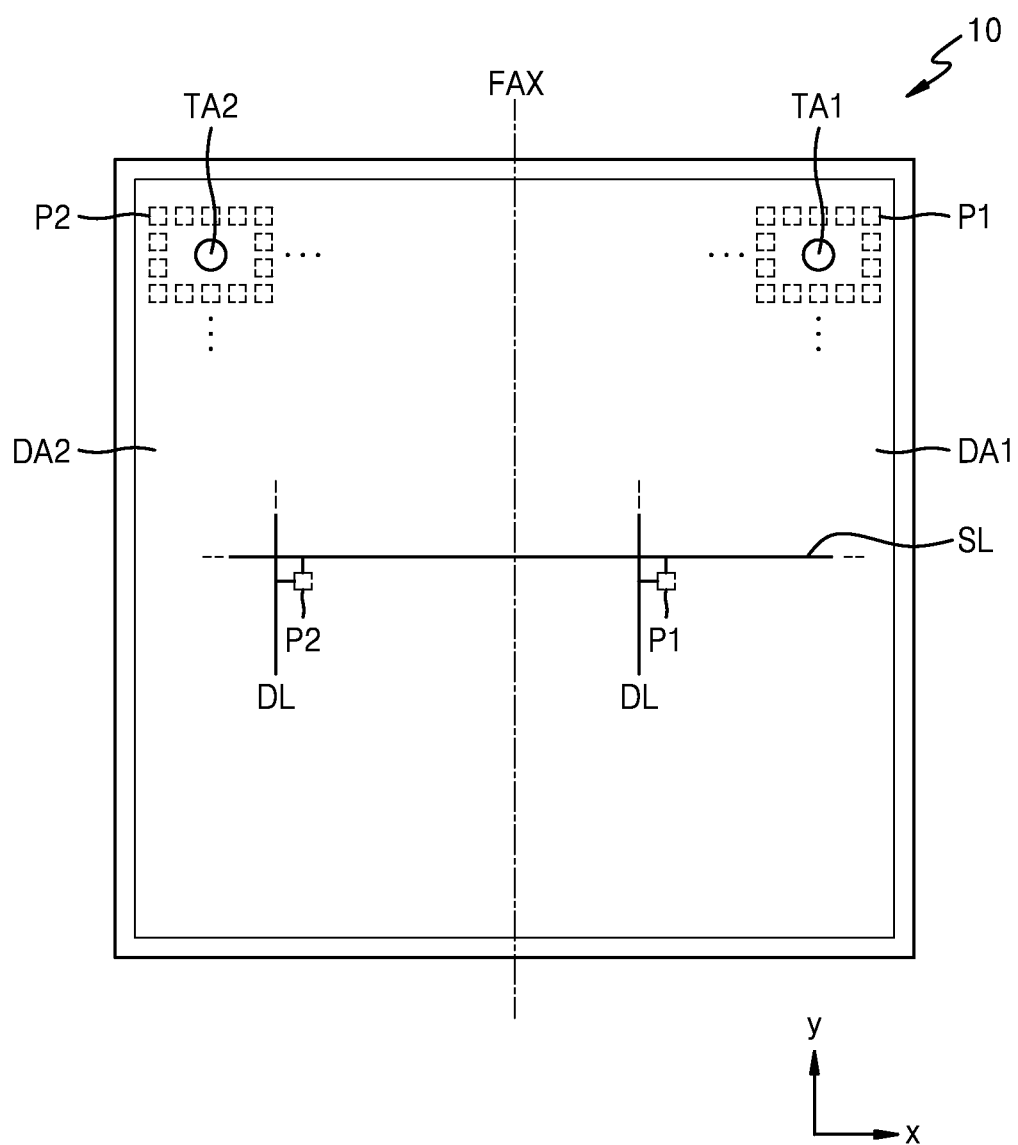
FIG. 3A is a plan view illustrating an arrangement of pixels of a first display panel according to an embodiment.
Figure 3B:
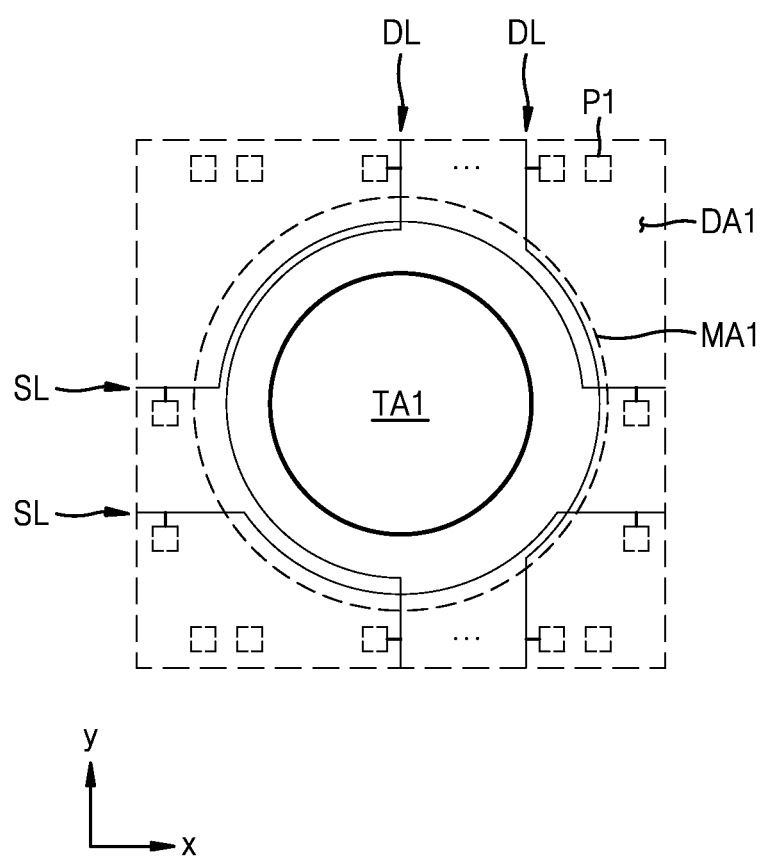
FIG. 3B is a plan view illustrating an area including a first transmission area of a first display panel according to an embodiment.
Figure 3C:
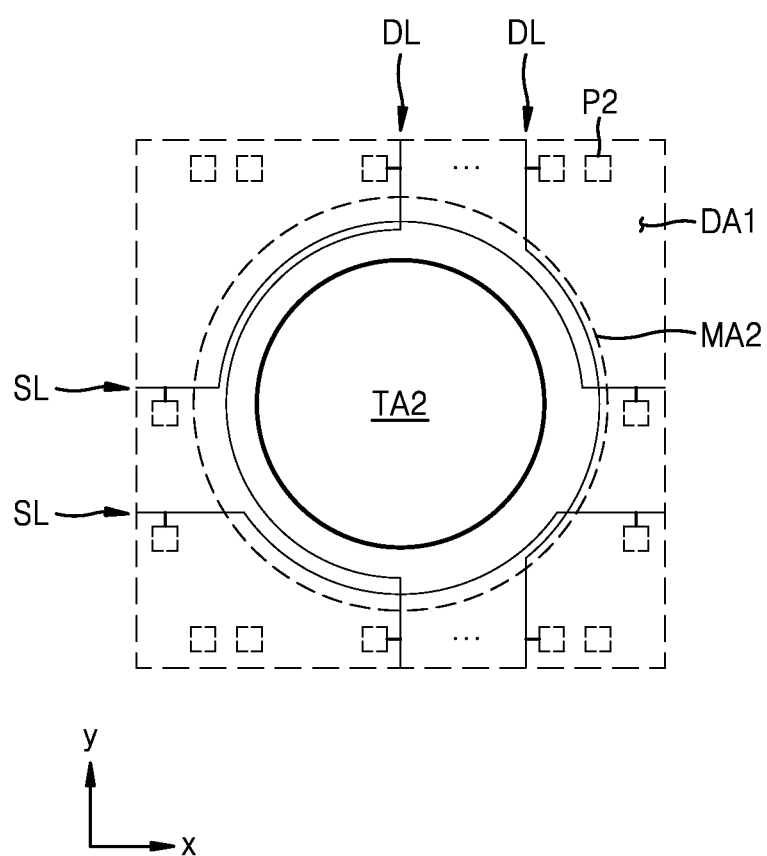
FIG. 3C is a plan view illustrating an area including a second transmission area of a first display panel according to an embodiment.
Figure 4A:
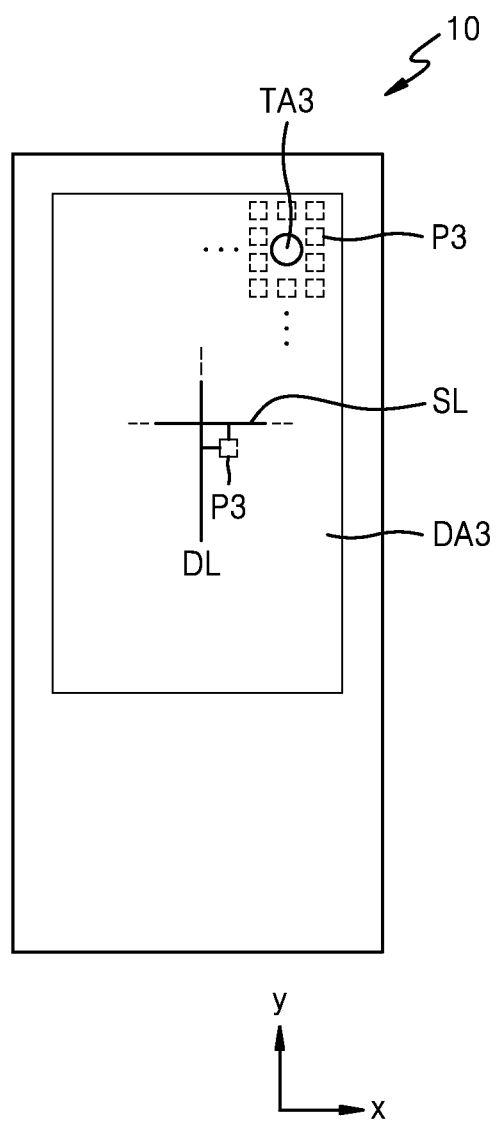
FIG. 4A is a plan view illustrating an arrangement of pixels of a second display panel according to an embodiment.

FIG. 1 schematically illustrates a display apparatus 10 according to an embodiment. FIG. 2 illustrates a folded state of the display apparatus 10 according to an embodiment. FIG. 3A is a plan view illustrating an arrangement of pixels of a first display panel 200 according to an embodiment. FIG. 3B is a plan view illustrating an area including a first transmission area TA1 of the first display panel 200 according to an embodiment. FIG. 3C is a plan view illustrating an area including a second transmission area TA2 of the first display panel 200 according to an embodiment. FIG. 4A is a plan view illustrating an arrangement of pixels of a second display panel 300 according to an embodiment. FIG. 4B is a plan view illustrating an area including a third transmission area TA3 of the second display panel 300 according to an embodiment.

Referring to FIG. 1, the display apparatus 10 may include a case 100 and the first display panel 200. The case 100 may include a first portion 110 and a second portion 120 configured to respectively support a first display section and a second display section of the first display panel 200. The case 100 may be folded based on a folding axis FAX between the first portion 110 and the second portion 120. According to an embodiment, a third portion 130 between the first portion 110 and the second portion 120 may have a hinge structure.

The first display panel 200 may have a display area including pixels for providing a certain image and may have a transmission area surrounded by pixels inside the display area. The first display panel 200 may be folded together with the case 100. In a folded state of the display apparatus 10, portions of the display area of the first display panel 200 (folded based on the folding axis FAX across the display area) may face/overlap each other. The portions of the display area may include a first display area DA1 and a second display area DA2 respectively positioned at the first display section and the second display section of the first display panel 200.

Referring to FIGS. 1 and 3A, a plurality of pixels may be arranged in the first display area DA1 and the second display area DA2 of the first display panel 200. Each of first pixels P1 arranged in the first display area DA1 may emit red, green, or blue light, and the first display area DA1 may provide a certain image using the light emitted from the first pixels P1. Each of second pixels P2 arranged in the second display area DA2 may emit red, green, or blue light, and the second display area DA2 may provide a certain image using the light emitted from the second pixels P2.

Each of first transmission area TA1 and the second transmission area TA2 may be surrounded by pixels and may contain no pixels. First pixels P1 may surround the first transmission area TA1, and second pixels P2 may surround the second transmission area TA2. The first pixels P1 may be arranged along an edge/perimeter of the first transmission area TA1, and the first transmission area TA1 may be positioned between two opposite first pixels P1. The second pixels P2 may be arranged along an edge/perimeter of the second transmission area TA2, and the second transmission area TA2 may be positioned between two opposite second pixels P2.

The first pixels P1 may be electrically connected to scan lines SL each substantially extending in a first direction (for example, an x direction) and data lines DL each substantially extending in a second direction (for example, a y direction). The scan lines SL and the data lines DL may detour around the first transmission area TA1. As illustrated in FIG. 3B, scan lines SL may substantially extend in the first direction and may detour around the edge of the first transmission area TA1, and data lines DL may substantially extend in the second direction and may detour around the edge of first transmission area TA1. Similarly, scan lines SL and the data lines DL connected to the second pixels P2 may detour around the edge of the second transmission area TA2, as illustrated in FIG. 3C.

Between the first transmission area TA1 and the first display area DA1, a first detour area MA1 may accommodate detouring sections of scan lines SL and/or data lines DL. Likewise, between the second transmission area TA2 and the second display area DA2, a second detour area MA2 may accommodate detouring sections of scan lines SL and/or data lines DL.

The display apparatus 10 may be folded based on the folding axis FAX, such that the first display area DA1 and the second display area DA2 may face/overlap each other. The first transmission area TA1 disposed inside the first display area DA1 and the second transmission area TA2 disposed inside the second display area DA2 may also face/overlap each other. The first transmission area TA1 and the second transmission area TA2 may be symmetrically disposed based on the folding axis FAX across the display area of the first display panel 200. For example, a distance from the folding axis FAX to a center of the first transmission area TA1 is substantially equal to a distance from the folding axis FAX to a center of the second transmission area TA2.

The display apparatus 10 may include the second display panel 300 configured to display an image in a direction different from an image display direction of the first display panel 200. Referring to FIG. 2, in the folded display apparatus 10, the second display panel 300 may display an image through an exposed third display area DA3, while the display area of the first display panel 200 is concealed. The second display panel 300 may be supported by a portion of the case 100. For example, the second display panel 300 may be supported by the second portion 120.

A plurality of third pixels P3 may be arranged in the third display area DA3. Each of the third pixels P3 may emit red, green, or blue light, and the third display area DA3 may provide a certain image using the light emitted from the third pixels P3.

The third transmission area TA3 may be surrounded by third pixels P3 and may contain no pixels. Third pixels P3 may surround the third transmission area TA3. The third pixels P3 may be arranged along an edge/perimeter of the third transmission area TA3, and the third transmission area TA3 may be positioned between two opposite third pixels P3.

The third pixels P3 may be electrically connected to scan lines SL each substantially extending in a first direction (for example, an x direction) and data lines DL each substantially extending in a second direction (for example, a y direction). Scan lines SL and data lines DL may detour around the third transmission area TA3. As illustrated in FIG. 4B, scan lines SL may substantially extend in the first direction and may detour around the edge of the third transmission area TA3, and data lines DL may substantially extend in the second direction and may detour around the edge of the third transmission area TA3.

Between the third transmission area TA3 and the third display area DA3, a third detour area MA3 may accommodate detouring sections of scan lines SL and/or the data lines DL.

Figure 5:
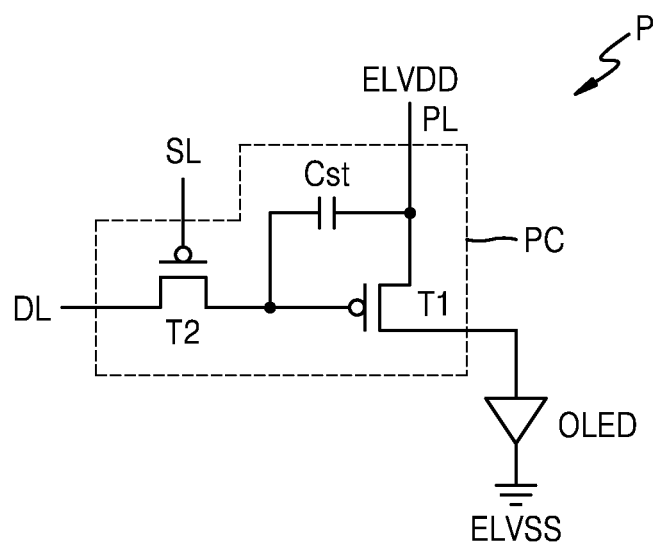
FIG. 5 is an equivalent circuit diagram of a pixel included in a first display panel and/or a second display panel of a display apparatus according to an embodiment.

FIG. 5 is an equivalent circuit diagram of a pixel P included in a first display panel and/or a second display panel of a display apparatus according to an embodiment.

Referring to FIG. 5, the pixel P may include a pixel circuit PC and an organic light-emitting diode OLED, which is a display element connected to the pixel circuit PC.

The pixel circuit PC may include a first thin film transistor T1, a second thin film transistor T2, and a storage capacitor Cst. Each pixel P may emit, for example, red, green, or blue light or red, green, blue, or white light through the organic light-emitting diode OLED.

The second thin film transistor T2 may include a switching thin film transistor, may be connected to a scan line SL and a data line DL, and may transmit, to the first thin film transistor T1, a data voltage provided from the data line DL, based on a switching voltage provided from the scan line SL. The storage capacitor Cst may be connected to the second thin film transistor T2 and a driving voltage line PL and may store a voltage corresponding to a difference between a voltage received from the second thin film transistor T2 and a first power voltage ELVDD supplied to the driving voltage line PL.

The first thin film transistor T1 may include a driving thin film transistor and may be connected to the driving voltage line PL and the storage capacitor Cst. Also, the first thin film transistor T1 may control a driving current flowing from the driving voltage line PL through the organic light-emitting diode OLED, in correspondence with a voltage value stored in the storage capacitor Cst. The organic light-emitting diode OLED may emit light having a certain brightness based on the driving current. A common electrode (for example, a cathode) of the organic light-emitting diode OLED may receive a second power voltage ELVSS.

FIG. 5 illustrates the case in which the pixel circuit PC includes two thin film transistors and one storage capacitor. However, the disclosure is not limited thereto. The number of thin film transistors and the number of storage capacitors may be modified in various ways according to the design of the pixel circuit PC. For example, the pixel circuit PC may include three or more thin film transistors.

The pixel P described with reference to FIG. 5 may correspond to one of the first pixels P1, the second pixels P2, and the third pixels P3 described above with reference to FIGS. 3A through 4B. For example, the first pixels P1 may include a first pixel circuit and a first organic light-emitting diode connected to the first pixel circuit, the second pixels P2 may include a second pixel circuit and a second organic light-emitting diode connected to the second pixel circuit, and the third pixels P3 may include a third pixel circuit and a third organic light-emitting diode connected to the third pixel circuit. The first pixel circuit and the second pixel circuit may include the same number of thin film transistors and the same number of storage capacitors. The third pixel circuit may include the same number of thin film transistors and the same number of storage capacitors as the first pixel circuit and the second pixel circuit. Alternatively, the third pixel circuit may include a different number of thin film transistors and a different number of storage capacitors from the first pixel circuit and the second pixel circuit.

Figure 6A:
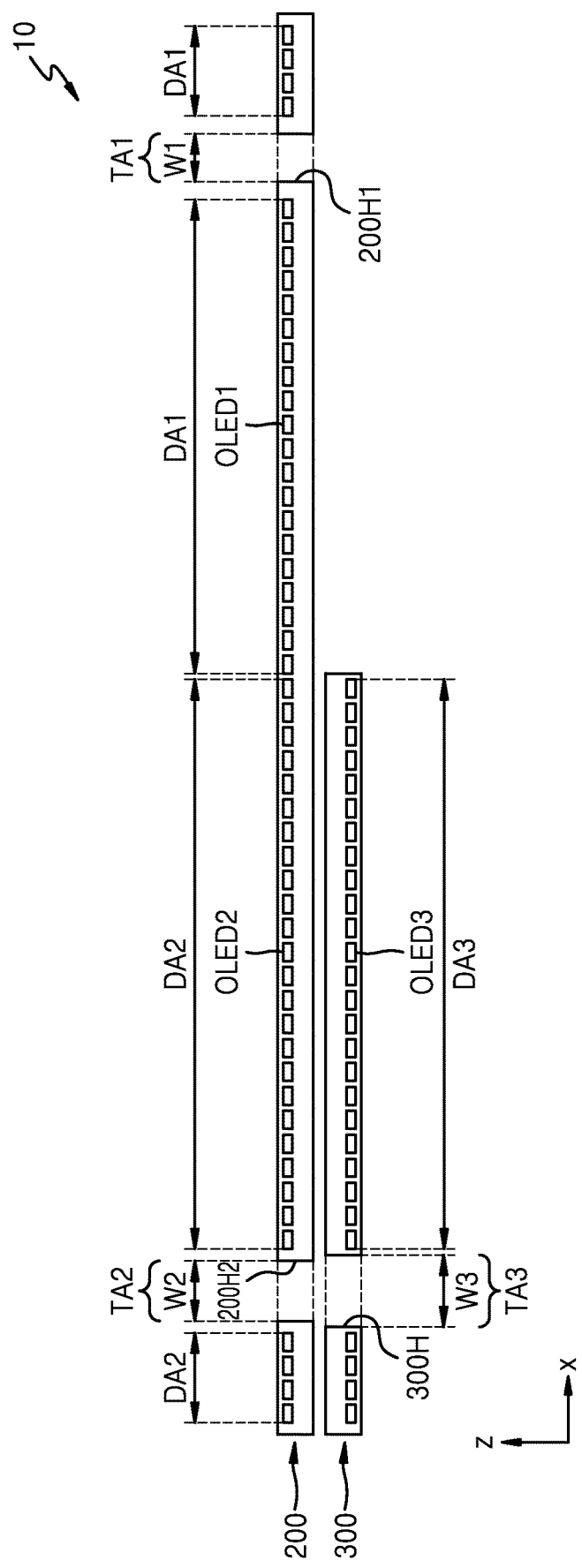
FIG. 6A is a cross-sectional view illustrating a first display panel and a second display panel when a display apparatus is in an unfolded state according to an embodiment.
Figure 6B:
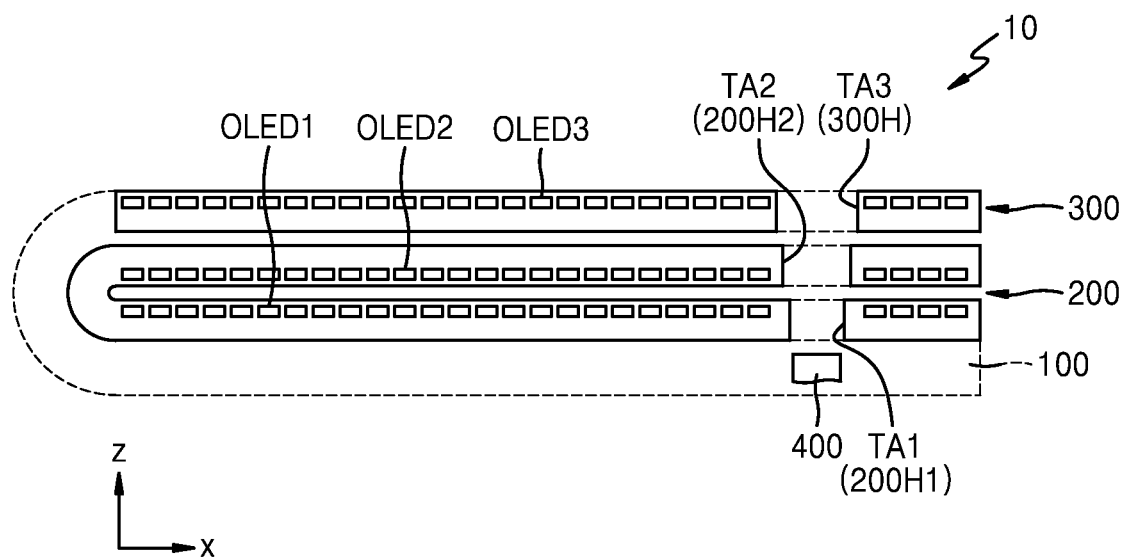
FIG. 6B is a cross-sectional view illustrating a first display panel and a second display panel when a display apparatus is in a folded state according to an embodiment.

Each of FIGS. 6A and 6B is a cross-sectional view illustrating the first display panel 200 and the second display panel 300 of the display apparatus 10 according to an embodiment, wherein FIG. 6A illustrates an unfolded state of the display apparatus 10, and FIG. 6B illustrates a folded state of the display apparatus 10.

Referring to FIG. 6A, the first display panel 200 may include a plurality of display elements, such as first organic light-emitting diodes OLED1 located in the first display area DA1 and second organic light-emitting diodes OLED2 located in the second display area DA2. The first display panel 200 may have a first hole 200H1 and a second hole 200H2 corresponding/belonging to the first transmission area TA1 and the second transmission area TA2, respectively.

The second display panel 300 may include third organic light-emitting diodes OLED3. The third organic light-emitting diodes OLED3 may be arranged in the third display area DA3. The second display panel 300 may have a relatively smaller display area than the first display panel 200 and may overlap a portion of the first display panel 200. A width (for example, a width in an x direction) of the second display panel 300 may be less than a width of the first display panel 200. The second display panel 300 may have a third hole 300H corresponding/belonging to the third transmission area TA3.

In the unfolded state of the display apparatus 10, the second display panel 300 may overlap only a portion of the first display panel 200 corresponding to the second display area DA2. For example, in the unfolded state of the display apparatus 10, the third display area DA3 may overlap the second display area DA2 and may not overlap the first display area DA1, and the third transmission area TA3 may overlap the second transmission area TA2 and may not overlap the first transmission area TA1. A width W3 of the third transmission area TA3 may be equal to or greater than a width W2 of the second transmission area TA2 in the x direction, and the width W2 of the second transmission area TA2 in the x direction may be equal to or greater than a width W1 of the first transmission area TA1 in the x direction. In an embodiment, when side surfaces of the first display panel 200 which respectively defines the first and second holes 200H1 and 200H2 are inclined, each of the widths W1 and W2 may mean a minimum width. Similarly, when a side surface of the second display panel 300, which defines the third hole 300H is inclined, the width W3 may mean a minimum width.

A perimeter of the second transmission area TA2 may surround a perimeter of the first transmission area TA1 in a plan view of the foldable display apparatus 10 when the foldable display apparatus 10 is in the folded state. A perimeter of the third transmission area TA3 may surround a perimeter of the second transmission area TA2 in a plan view of the foldable display apparatus 10 when the foldable display apparatus 10 is in the folded state.

Referring to FIG. 6B, when the display apparatus 10 is folded, the first display panel 200, which is a flexible display panel, may also be folded. In the folded state of the display apparatus 10, the third display area DA3 may overlap the second display area DA2 and the first display area DA1, and the third transmission area TA3 may overlap the second transmission area TA2 and the first transmission area TA1.

The display apparatus 10 may include a component 400 overlapping the first transmission area TA1, the second transmission area TA2, and the third transmission area TA3 when the display apparatus 10 is in a folded state. The component 400 may be disposed between the first display panel 200 and the case 100. The first transmission area TA1, the second transmission area TA2, and the third transmission area TA3 may correspond to a location of the component 400. The first transmission area TA1, the second transmission area TA2, and the third transmission area T3 may be positioned at a component area (for example, a camera area, a sensor area, etc.).

The component 400 may be an electronic element configured to output and/or receive sound and/or light. For example, the electronic element may include at least one of a sensor configured to output and/or receive light, such as an infrared sensor, a camera configured to capture an image by receiving light, a small lamp configured to output light, a speaker configured to output sound, a microphone configured to receive sound, etc. The sensor may include a proximity sensor, a brightness sensor, an iris recognition sensor, a fingerprint recognition sensor, etc. The electronic element using light may use pieces of light of one or more wavelength ranges, such as visible rays, infrared rays, ultraviolet rays, etc.

The first transmission area TA1, the second transmission area TA2, and the third transmission area TA3 may be areas through which sound or/and light proceeding from the component 400 to an external entity outside the display apparatus 10 or proceeding toward the component 400 may be transmitted. The sound and/or light emitted from the component 400 may be transmitted through the first transmission area TA1, the second transmission area TA2, and the third transmission area TA3 to the external entity. External sound and/or sound may be transmitted through the first transmission area TA1, the second transmission area TA2, and the third transmission area TA3 to the component 400.

The width W3 of the third transmission area TA3 may be equal to or greater than the width W2 of the second transmission area TA2, and the width W2 of the second transmission area TA2 may be equal to or greater than the width W1 of the first transmission area TA1. Advantageously, interference of sound and/or light transmitted through the first transmission area TA1, the second transmission area TA2, and the third transmission area TA3 may be minimized.

Figure 7:
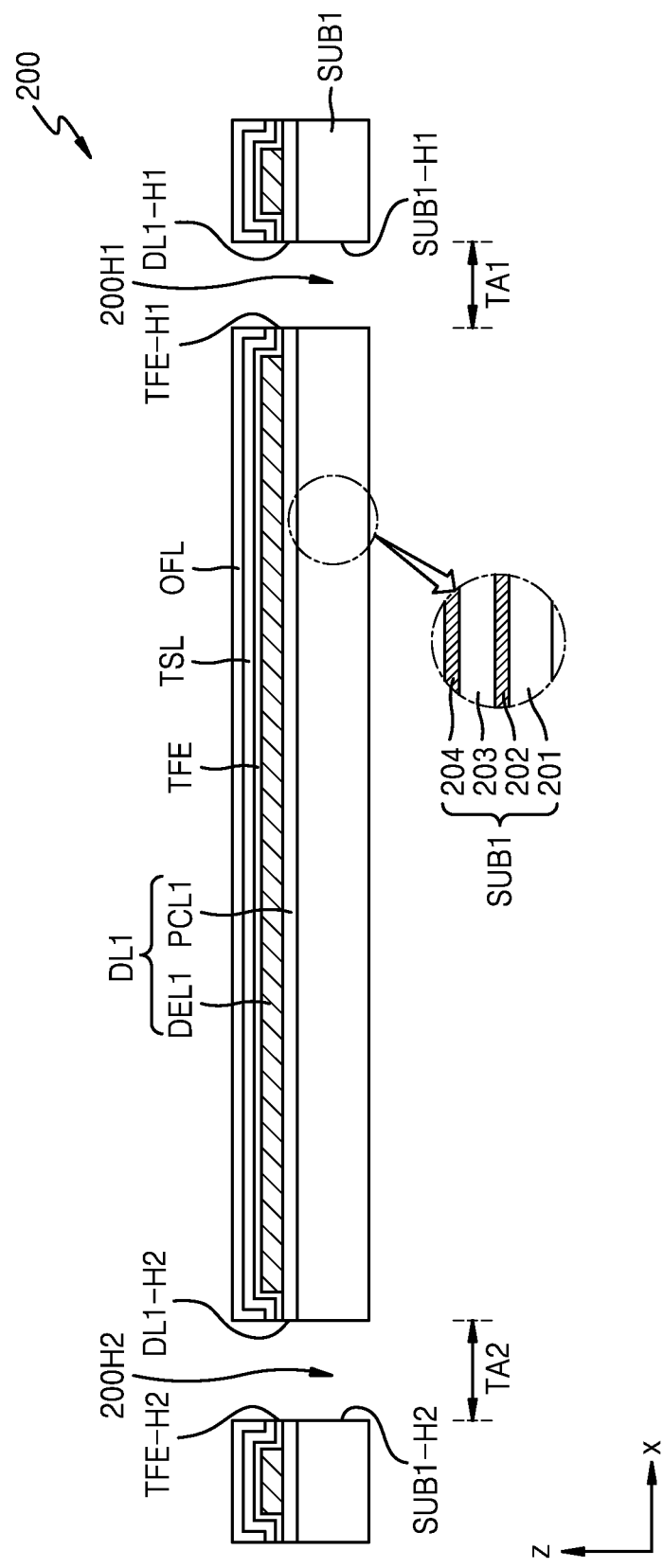
FIG. 7 is a cross-sectional view schematically illustrating a first display panel according to an embodiment.

FIG. 7 is a cross-sectional view schematically illustrating the first display panel 200 according to an embodiment. FIG. 7 illustrates an unfolded state of the display apparatus 10.

Referring to FIG. 7, the first display panel 200 may include a first display layer DL1 disposed on a first substrate SUB1. The first substrate SUB1 may be flexible. The first substrate SUB1 may include polymer resins and may have a multi-layered structure. For example, the first substrate SUB1 may include a first base layer 201, a first barrier layer 202, a second base layer 203, and a second barrier layer 204 that are sequentially stacked.

Each of the first base layer 201 and the second base layer 203 may include one or more polymer resins. For example, the first and second base layers 201 and 203 may include one or more of polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc.

The first barrier layer 202 and the second barrier layer 204 may prevent penetration of external contaminants and may include a single layer or multiple layers including an inorganic material, such as silicon nitride ($SiN_x$, x>0), silicon oxide ($SiO_x$, x>0), etc.

The first display layer DL1 may include a first display element layer DEL1 including a plurality of display elements and a first pixel circuit layer PCL1 including a pixel circuit and insulating layers. The first display element layer DEL1 may include display elements, for example, the first organic light-emitting diodes OLED1 and the second organic light-emitting diodes OLED2 described above with reference to FIGS. 6A and 6B. The first pixel circuit layer PCL1 may include pixel circuits and the insulating layers, wherein each of the pixel circuits may be connected to each of the first organic light-emitting diodes OLED1 or each of the second organic light-emitting diodes OLED2. The first pixel circuit layer PCL1 may include a plurality of transistors, a plurality of storage capacitors, and insulating layers between the transistors and the storage capacitors.

The display elements may be covered by an encapsulation member, such as a thin film encapsulation layer TFE. The thin film encapsulation layer TFE may include at least one inorganic encapsulation layer and at least one organic encapsulation layer covering the first display element layer DEL1. The first display panel 200 including the first substrate SUB1 including polymer resins and the thin film encapsulation layer TFE including the inorganic encapsulation layer and the organic encapsulation layer may be a flexible display panel having flexible properties.

A touch electrode layer TSL including touch electrodes may be disposed on the thin film encapsulation layer TFE, and an optical functional layer OFL may be disposed on the touch electrode layer TSL. The touch electrode layer TSL may obtain coordinate information based on an external input, for example, a touch event. The optical functional layer OFL may reduce a reflectivity of light (external light) incident from the outside toward the first display panel 200 and/or improve the color purity of light emitted from the first display panel 200. According to an embodiment, the optical functional layer OFL may include a phase retarder and a polarizer. The phase retarder may include a film-type phase retarder or a liquid crystal coating-type phase retarder, and may include a λ/2 phase retarder and/or a λ/4 phase retarder. The polarizer may also include a film-type polarizer or a liquid crystal coating-type polarizer. The film-type polarizer may include an elongation-type synthetic resin film, and the liquid crystal coating-type polarizer may include liquid crystals arranged in a certain shape of arrangement. The phase retarder and the polarizer may further include a protective film.

The optical functional layer OFL may include a black matrix and color filters. The color filters may be arranged by taking into account a color of light emitted from each pixel in the first display panel 200. Each of the color filters may include a red, green, or blue pigment or dye. Each of the color filters may further include quantum dots, in addition to the pigment or the dye described above. Some of the color filters may not include the pigment or the dye described above, and may include scattered particles, such as oxide titanium.

The optical functional layer OFL may include a destructive interference structure. The destructive interference structure may include a first reflective layer and a second reflective layer disposed on different layers from each other. Destructive interference may occur to first reflective light and second reflective light reflected from the first reflective layer and the second reflective layer, respectively, and thus, the reflectivity of external light may be decreased.

The first display panel 200 may have the first hole 200H1 and the second hole 200H2 corresponding/belonging to the first transmission area TA1 and the second transmission area TA2, respectively. The plurality of layers included in the first display panel 200, that is, the first substrate SUB1, the first display layer DL1, and the thin film encapsulation layer TFE may include through-holes SUB1-H1, SUB1-H2, DL1-H1, DL1-H2, TFE-H1, and TFE-H2, respectively, which correspond to and/or constitute the first hole 200H1 and the second hole 200H2.

Figure 8:
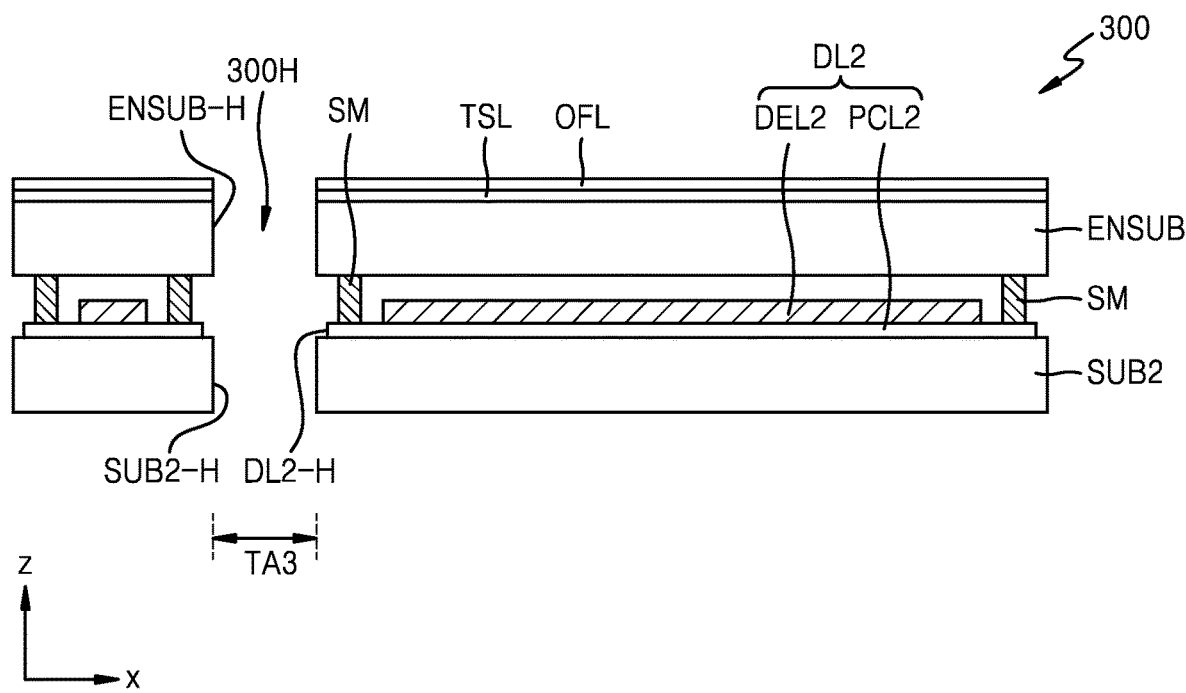
FIG. 8 is a cross-sectional view schematically illustrating a second display panel according to an embodiment.

FIG. 8 is a cross-sectional view schematically illustrating the second display panel 300 according to an embodiment.

Referring to FIG. 8, the second display panel 300 may include a second display layer DL2 disposed on a second substrate SUB2. The second substrate SUB2 may include a glass material or polymer resins. When the second substrate SUB2 includes polymer resins, the second substrate SUB2 may have a multi-layered structure analogous to the multi-layered structure described above with reference to FIG. 7.

The second display layer DL2 may be disposed on the second substrate SUB2. The second display layer DL2 may include a second display element layer DEL2 including a plurality of display elements and a second pixel circuit layer PCL2 including a pixel circuit and insulating layers.

The second display element layer DEL2 may include the display elements, for example, the third organic light-emitting diodes OLED3 described above with reference to FIGS. 6A and 6B. The second pixel circuit layer PCL2 may include pixel circuits and insulating layers, wherein each of the pixel circuits may be connected to each of the third organic light-emitting diodes OLED3. The second pixel circuit layer PCL2 may include a plurality of transistors, a plurality of storage capacitors, and insulating layers between the transistors and the storage capacitors.

The display elements may be covered by an encapsulation member, such as an encapsulation substrate ENSUB. The encapsulation substrate ENSUB may include a glass material or polymer resins. The encapsulation substrate ENSUB may be disposed to face the second substrate SUB2 with the intervening second display layer DL2, and a sealing member SM may be disposed between the second substrate SUB2 and the encapsulation substrate ENSUB. The sealing member SM may include frit or a material, such as epoxy. The second display element layer DEL2 disposed in the middle of the sealing member SM, the second substrate SUB2, and the encapsulation substrate ENSUB may be protected from external water.

A touch electrode layer TSL and an optical functional layer OFL may be disposed on the encapsulation substrate ENSUB.

The second display panel 300 may have a third hole 300H corresponding/belonging to the third transmission area TA3. The plurality of layers included in the second display panel 300, that is, the second substrate SUB2, the second display layer DL2, and the encapsulation substrate ENSUB, may include through-holes SUB2-H, DL2-H, and ENSUB-H, respectively, corresponding to and/or constituting the third hole 300H.

The second display panel 300 may be a rigid display panel including the second substrate SUB2 including a glass material and the encapsulation substrate ENSUB. The second display panel 300 may be a flexible display panel including the second substrate SUB2 including polymer resins and the thin film encapsulation layer TFE illustrated in FIG. 7. The second display panel 300 may be a hybrid-type display panel including the second substrate SUB2 including a glass material and the thin film encapsulation layer TFE described with reference to FIG. 7, and in this case, a thickness of the second display panel 300 may be relatively decreased.

Figure 9:
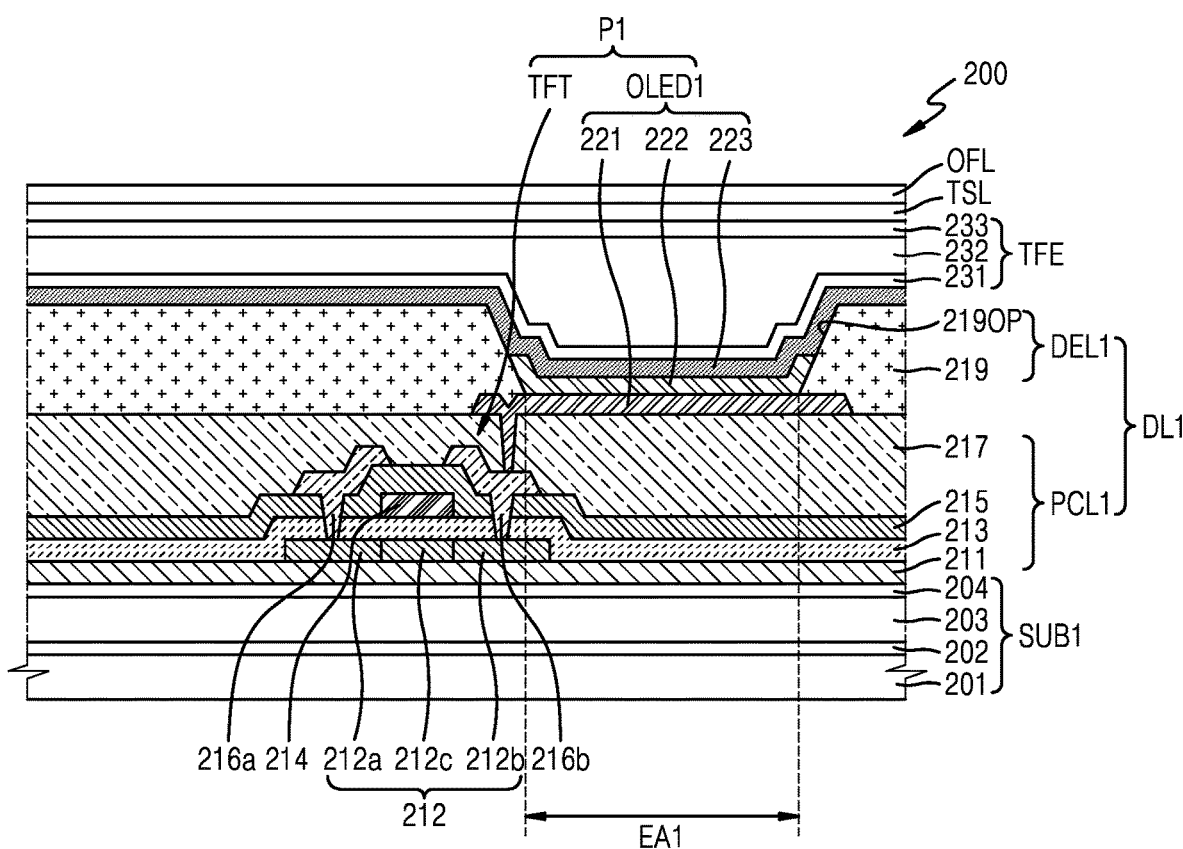
FIG. 9 is a cross-sectional view corresponding to a first pixel of a first display panel according to an embodiment.

FIG. 9 is a view illustrating a cross-section corresponding to a first pixel, which is one of pixels of a first display panel according to an embodiment.

Referring to FIG. 9, the first substrate SUB1 may include the first base layer 201, the first barrier layer 202, the second base layer 203, and the second barrier layer 204 that are sequentially stacked, as described above with reference to FIG. 7.

The first pixel circuit layer PCL1 may be disposed on the first substrate SUB1. According to an embodiment, FIG. 9 illustrates that the first pixel circuit layer PCL1 may include the thin film transistor TFT and insulating layers each arranged over and/or under elements of the thin film transistor TFT. The insulating layers may include a first buffer layer 211, a first gate insulating layer 213, a first interlayer insulating layer 215, and a first planarization insulating layer 217.

The first buffer layer 211 may include an inorganic insulating material, such as $SiN_x$, silicon oxynitride (SiON), and $SiO_x$, and may include a single layer or multiple layers including the inorganic insulating materials described above.

A thin film transistor TFT may include a first semiconductor layer 212, and the first semiconductor layer 212 may include polysilicon. Alternatively, the first semiconductor layer 212 may include amorphous silicon, an oxide semiconductor, or an organic semiconductor. The first semiconductor layer 212 may include a channel area 212c, and a drain area 212a and a source area 212b disposed at both sides of the channel area 212c. A first gate electrode 214 may overlap the channel area 212c.

The first gate electrode 214 may include a low-resistance metal material. The first gate electrode 214 may include a conductive material including Mo, Al, Cu, Ti, etc. and may include multiple layers or a single layer including the conductive materials described above.

The first gate insulating layer 213 between the first semiconductor layer 212 and the first gate electrode 214 may include an inorganic insulating material, such as $SiO_x$, $SiN_x$, SiON, aluminum oxide, titanium oxide, tantalum oxide, hafnium oxide, etc. The first gate insulating layer 213 may include a single layer or multiple layers including the materials described above.

The first interlayer insulating layer 215 may cover the first gate electrode 214. The first interlayer insulating layer 215 may include an inorganic insulating material, such as at least one of $SiO_x$, $SiN_x$, SiON, aluminum oxide, titanium oxide, tantalum oxide, hafnium oxide, etc.

Each of a first drain electrode 216a and a first source electrode 216b may be located on the first interlayer insulating layer 215. The first drain electrode 216a and the first source electrode 216b may include a highly conductive material. The first drain electrode 216a and the first source electrode 216b may include a conductive material, such as Mo, Al, Cu, Ti, etc., and may include multiple layers or a single layer including the materials described above. According to an embodiment, the first drain electrode 216a and the first source electrode 216b may have a multi-layered structure of Ti/Al/Ti.

The first planarization insulating layer 217 may include an organic insulating layer. The first planarization insulating layer 217 may include an organic insulating material, such as a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The first display element layer DEL1 may be disposed on the first pixel circuit layer PCL1 having the structure described above. The first display element layer DEL1 may include the first organic light-emitting diode OLED1, wherein a pixel electrode 221 of the first organic light-emitting diode OLED1 may be electrically connected to the thin film transistor TFT through a contact hole of the first planarization insulating layer 217.

The pixel electrode 221 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 221 may include a reflective layer including Ag, Mg, Al, Pt, Pd, Au, Ni, Nd, Ir, Cr, or a compound thereof. According to another embodiment, the pixel electrode 221 may further include a layer including ITO, IZO, ZnO or $In_2O_3$ above/below the reflective layer described above.

A pixel-defining layer 219 having an opening 2190P exposing a central portion of the pixel electrode 221 may be disposed on the pixel electrode 221. The pixel-defining layer 219 may include an organic insulating material and/or an inorganic insulating material. The opening 2190P may define an emission area (hereinafter, referred to as a first emission area EA1) of the light emitted from the first organic light-emitting diode OLED1. For example, a width of the opening 2190P may correspond to a width of the first emission area EA1.

An emission layer 222 may be disposed in the opening 2190P of the pixel-defining layer 219. The emission layer 222 may include a high molecular-weight or a low molecular-weight organic material emitting light of a certain color. Although not shown, a first functional layer and a second functional layer may be respectively disposed below and above the emission layer 222. The first functional layer may include, for example, a hole transport layer (HTL), or an HTL and a hole injection layer (HIL). The second functional layer may be disposed above the emission layer 222 and may be optional. The second functional layer may include an electron transport layer (ETL) and/or an electron injection layer (EIL). The first functional layer and/or the second functional layer may be a common layer formed to generally cover the first substrate SUB1 like a common electrode 223 to be described below.

The common electrode 223 may include a conductive material having a low work function. For example, the common electrode 223 may include a (semi) transparent layer including Ag, Mg, Al, Pt, Pd, Au, Ni, Nd, Ir, Cr, Li, Ca, or an alloy thereof. The common electrode 223 may further include a layer, such as ITO, IZO, ZnO, or $In_2O_3$, on the (semi) transparent layer including the materials described above.

The thin film encapsulation layer TFE may include at least one inorganic encapsulation layer and at least one organic encapsulation layer. According to an embodiment, FIG. 9 illustrates that the thin film encapsulation layer TFE may include a first inorganic encapsulation layer 231, an organic encapsulation layer 232, and a second inorganic encapsulation layer 233 that are sequentially stacked.

The first inorganic encapsulation layer 231 and the second inorganic encapsulation layer 233 may include at least one inorganic material from among aluminum oxide, titanium oxide, tantalum oxide, hafnium oxide, ZnO, $SiO_x$, $SiN_x$, and SiON. The organic encapsulation layer 232 may include a polymer-based material. The polymer-based material may include acryl-based resins, epoxy-based resins, PI, and polyethylene. According to an embodiment, the organic encapsulation layer 232 may include acrylate.

So far, the cross-sectional structure corresponding to the first pixel P1, which is a portion of the first display panel 200, is described by referring to FIG. 9. However, the disclosure is not limited thereto. The second pixel P2, which is a portion of the first display panel 200, may have the same structure as the first pixel P1 described with reference to FIG. 9. For example, the second organic light-emitting diode OLED2 of the second pixel P2 may include a pixel electrode, an emission layer, and a common electrode. Also, a second emission area of the second organic light-emitting diode OLED2 may be defined by an opening of a pixel-defining layer exposing the pixel electrode of the second organic light-emitting diode OLED2 in the same manner as described above with reference to FIG. 9.

Figure 10:
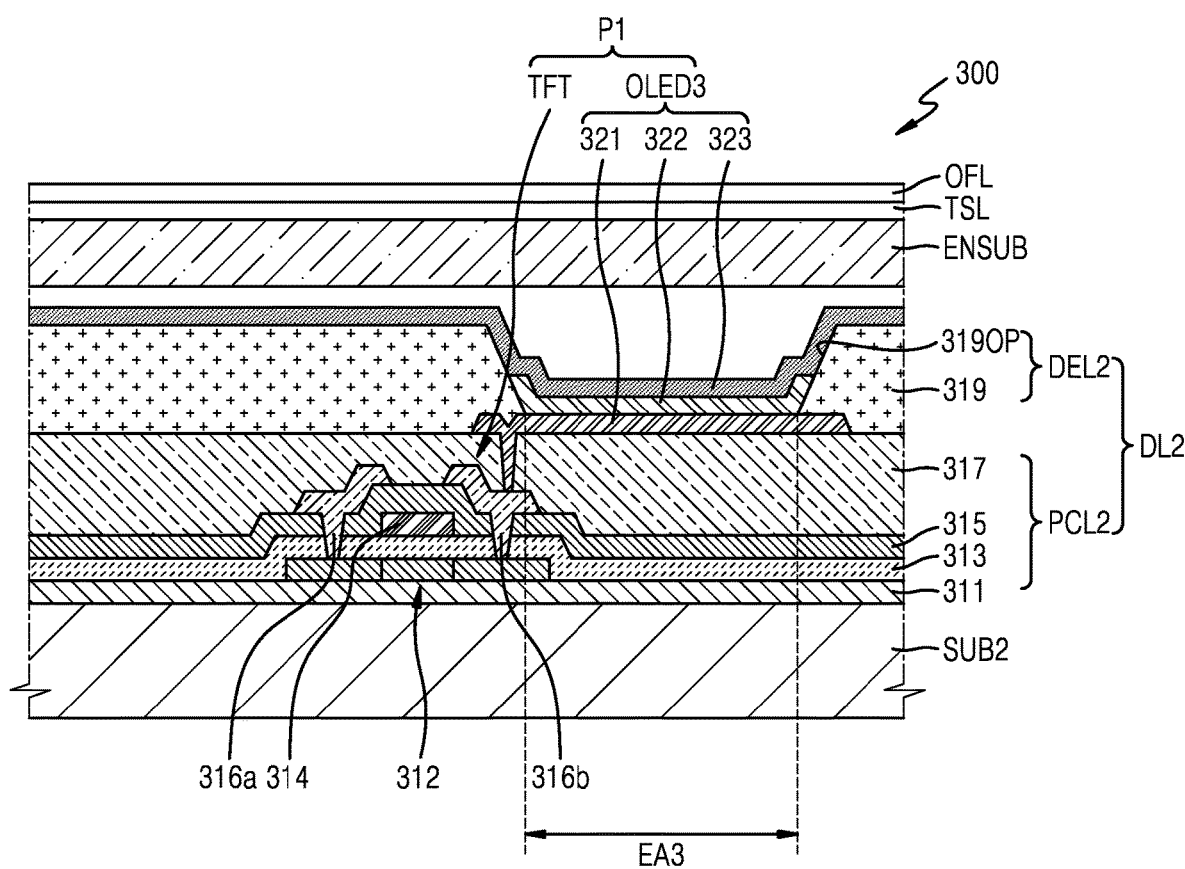
FIG. 10 is a cross-sectional view corresponding to a third pixel of a second display panel according to an embodiment.

FIG. 10 is a view illustrating a cross-section corresponding to a third pixel, which is any one of pixels of the second display panel 300, according to an embodiment.

Referring to FIG. 10, the second substrate SUB2 may include a glass material or polymer resins as described above with reference to FIG. 8. The second display panel 300 may be disposed on the second substrate SUB2 and may include the second display layer DL2 including the second pixel circuit layer PCL2 and the second display element layer DEL2. The second pixel circuit layer PCL2 may include the thin film transistor TFT, and insulating layers each arranged over and/or under elements of the thin film transistor TFT. Elements of the thin film transistor TFT may include a semiconductor layer 312, a gate electrode 314, a drain electrode 316a and a source electrode 316b. The insulating layers may be disposed below and/or above each of the elements. The features of the semiconductor layer 312, the gate electrode 314, the drain electrode 316a and the source electrode 316b are the same as the descriptions of the first semiconductor layer 212, the first gate electrode 214, and the first drain electrode 216a and the first source electrode 216b given above with reference to FIG. 9. The second pixel circuit layer PCL2 may include a second buffer layer 311, a second gate insulating layer 313, a second interlayer insulating layer 315, and a second planarization insulating layer 317. Their descriptions may be the same as the descriptions of the first buffer layer 211, the first gate insulating layer 213, the first interlayer insulating layer 215, and the first planarization insulating layer 217 given above with reference to FIG. 9.

The second display element layer DEL2 may include the third organic light-emitting diode OLED3, and the third organic light-emitting diode OLED3 may include a pixel electrode 321, an emission layer 322, and a common electrode 223. A first functional layer including an HIL and/or an HTL may further be disposed between the pixel electrode 321 and the emission layer 322. A second functional layer including an EIL and/or an ETL may further be disposed between the emission layer 322 and the common electrode 223.

A pixel-defining layer 319 having an opening 3190P exposing a central portion of the pixel electrode 321 may be disposed on the pixel electrode 321 of the third organic light-emitting diode OLED3. The pixel-defining layer 319 may include an organic insulating material and/or an inorganic insulating material. The opening 3190P may define an emission area (hereinafter, referred to as a third emission area EA3) of light emitted from the third organic light-emitting diode OLED3. For example, a width of the opening 3190P may correspond to a width of the third emission area EA3. The encapsulation substrate ENSUB may include a glass material as described above with reference to FIG. 8.

Figure 11:
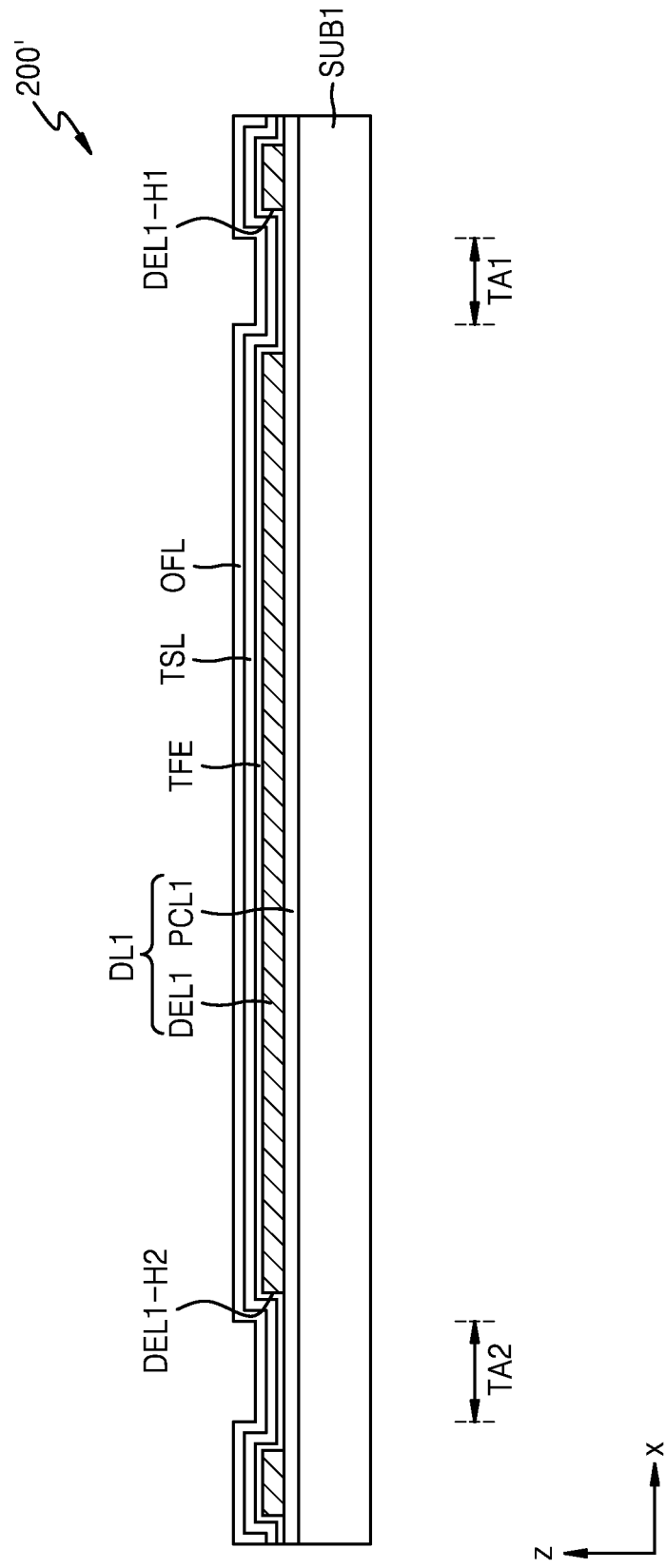
FIG. 11 is a cross-sectional view schematically illustrating a first display panel according to an embodiment.
Figure 12:
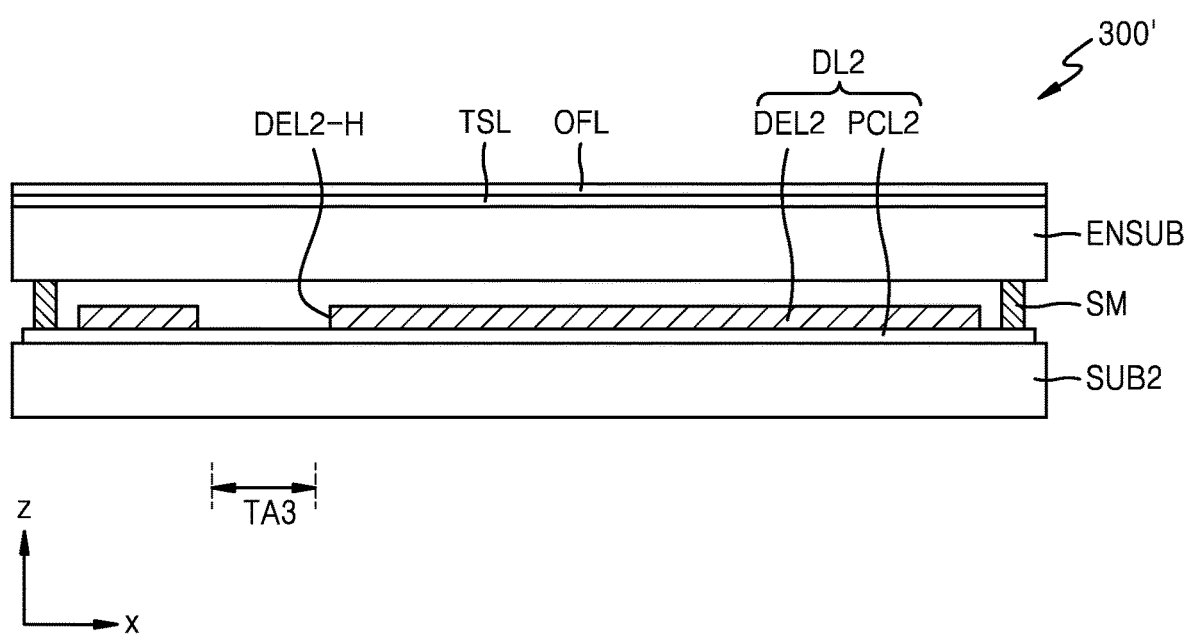
FIG. 12 is a cross-sectional view schematically illustrating a second display panel according to an embodiment.

FIG. 11 is a cross-sectional view schematically illustrating a first display panel 200' according to an embodiment, and FIG. 12 is a cross-sectional view schematically illustrating a second display panel 300' according to an embodiment. FIGS. 11 and 12 illustrate an unfolded state of the display apparatus 10.

The first display panel 200 described above with reference to FIG. 7 may have through holes, i.e., the first hole 200H1 and the second hole 200H2, corresponding to the first transmission area TA1 and the second transmission area TA2. The second display panel 300 described above with reference to FIG. 8 may have a through hole, i.e., the third hole 300H3, corresponding to the third transmission area TA3. Referring to FIGS. 11 and 12, the first display panel 200' and the second display panel 300' may not include through holes for transmission areas that extend through the thickness of the display panels 200' and 300' in a z direction.

As illustrated in FIG. 11, the first display panel 200' may include the first substrate SUB1, the first display layer DL1 including the first pixel circuit layer PCL1 and the first display element layer DEL1, and the thin film encapsulation layer TFE that are sequentially stacked. Each of the first substrate SUB1, the first pixel circuit layer PCL1, and the thin film encapsulation layer TFE of the first display panel 200' may not include a through hole corresponding to the first transmission area TA1 or the second transmission area TA2 that extends through the thickness of the first display panel 200'. The first display element layer DEL1 of the first display panel 200' may include through holes DEL1-H1 and DEL1-H2 corresponding to the first transmission area TA1 and the second transmission area TA2. No display elements, e.g., no organic light-emitting diodes, of the first display element layer DEL1 of the first display panel 200' may be positioned at the through holes DEL1-H1 and DEL1-H2, such that no display elements of the first display element layer DEL1 may correspond to the first transmission area TA1 and the second transmission area TA2. For example, a pixel electrode and/or a common electrode included in the first display element layer DEL1 may include holes corresponding to the first transmission area TA1 and the second transmission area TA2.

The touch electrode layer TSL and/or the optical functional layer OFL on the thin film encapsulation layer TFE may or may not include a through-hole corresponding to the first transmission area TA1 and the second transmission area TA2.

Referring to FIG. 12, the second display panel 300' may include the second substrate SUB2, the second display layer DL2 including the second pixel circuit layer PCL2 and the second display element layer DEL2, and the encapsulation substrate ENSUB that are sequentially stacked. Each of the second substrate SUB2, the second pixel circuit layer PCL2, and the encapsulation substrate ENSUB of the second display panel 300' may not include a through-hole corresponding to the third transmission area TA3. The second display element layer DEL2 of the second display panel 300' may include a through-hole DEL2-H corresponding to the third transmission area TA3. No display elements of the second display element layer DEL2 of the second display panel 300' may be positioned at the through-hole DEL2-H, such that no display elements of the second display element layer DEL2 may correspond to the third transmission area TA3. For example, a pixel electrode and/or a common electrode included in the second display element layer DEL2 may include a hole corresponding to the third transmission area TA3. The touch electrode layer TSL and/or the optical functional layer OFL on the encapsulation substrate ENSUB may or may not include a through-hole corresponding to the third transmission area TA3.

Figure 13A:
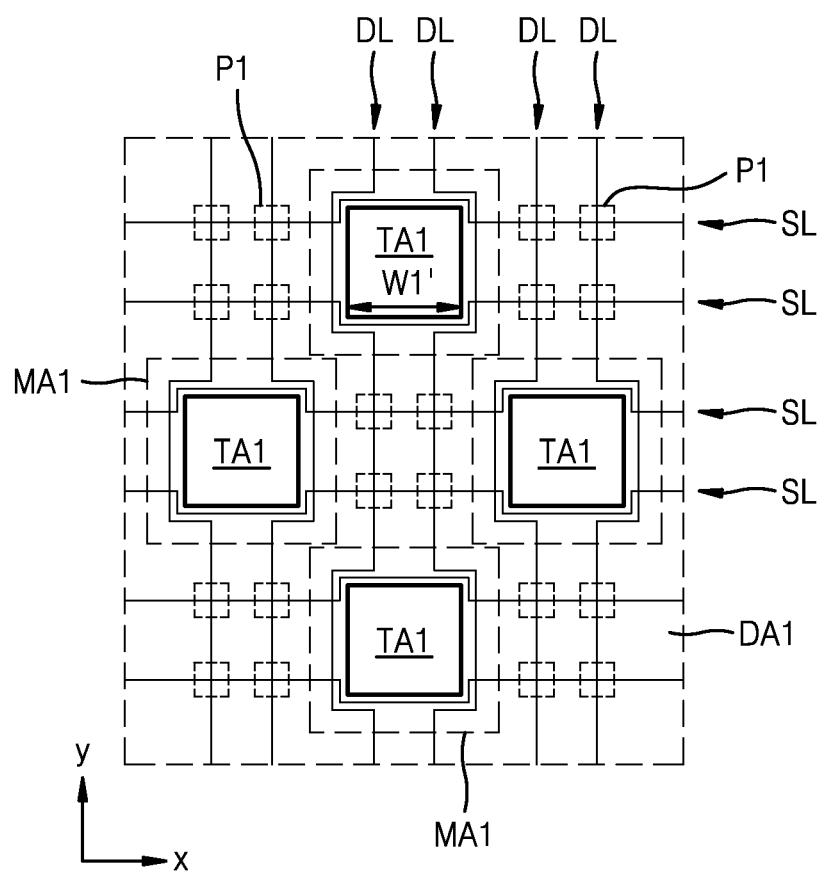
FIG. 13A is a plan view illustrating an area including a first transmission area of a first display panel according to an embodiment.
Figure 13B:
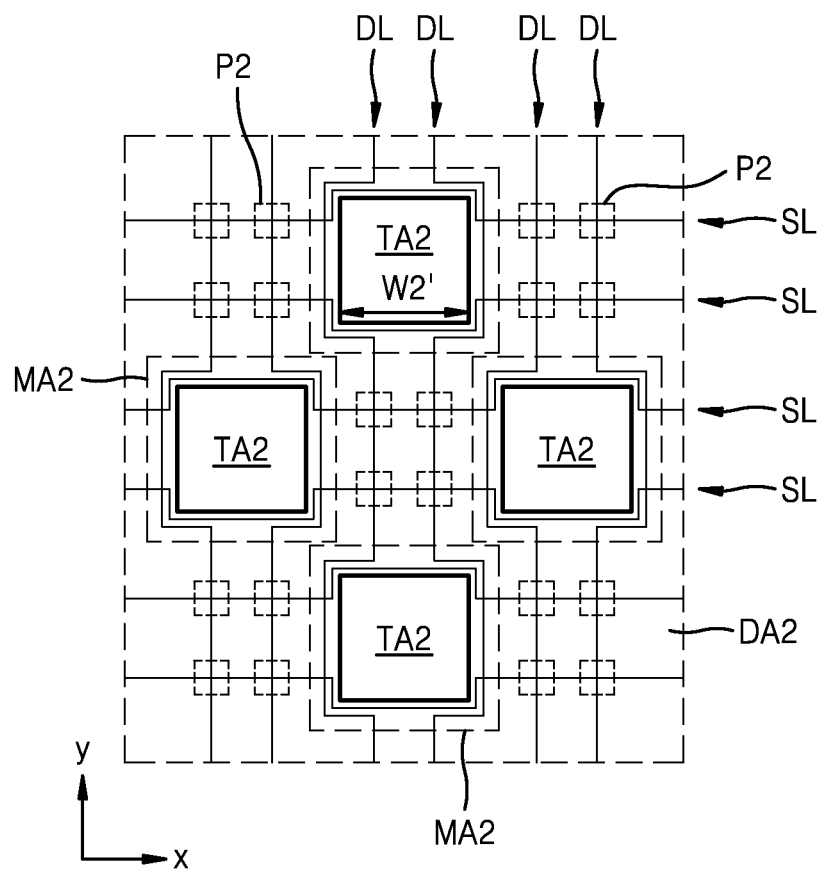
FIG. 13B is a plan view illustrating an area including a second transmission area of a first display panel according to another embodiment.
Figure 13C:
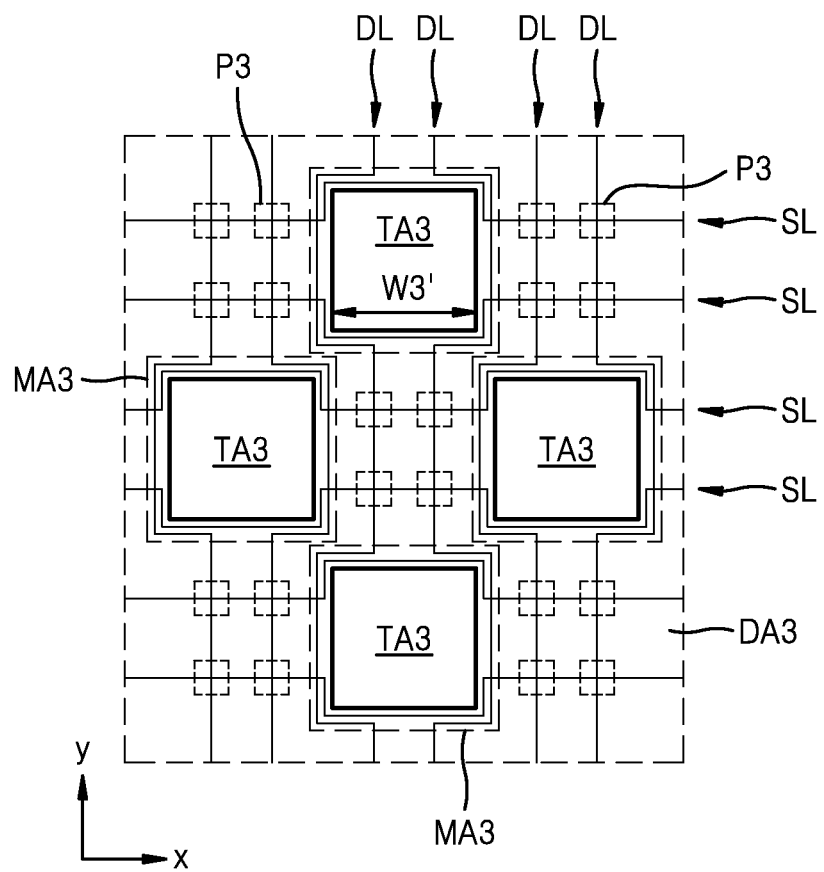
FIG. 13C is a plan view illustrating an area including a third transmission area of a second display panel, according to another embodiment.

FIGS. 13A and 13B are plan views illustrating areas including first transmission areas TA1 and second transmission areas TA2 of a first display panel according to an embodiment. FIG. 13C is a plan view illustrating an area including third transmission areas TA3 of a second display panel according to another embodiment.

Referring to FIG. 13A, a plurality of first transmission areas TA1 may be spaced from one another, and first pixels P1 may be arranged around the first transmission areas TA1. Two adjacent/opposite first pixels P1 may be spaced from each other with one intervening first transmission area TA1. Some first pixels P1 may be arranged between adjacent first transmission areas TA1.

The first pixels P1 may be electrically connected to scan lines SL each substantially extending in a first direction and data lines DL each substantially extending in a second direction. The scan lines SL and the data lines DL may detour around the first transmission areas TA1. The first detour area MA1 may accommodate detouring sections of the scan lines SL and/or the data lines DL and may be disposed between the first transmission areas TA1 and the first display area DA1.

Referring to FIG. 13B, a plurality of second transmission areas TA2 may be disposed in the second display area DA2 and may be spaced from one another. The second pixels P2 may be arranged around the second transmission areas TA2. Two adjacent/opposite second pixels P2 may be spaced from each other with one intervening second transmission area TA2. Some second pixels P2 may be arranged between adjacent second transmission areas TA2.

The second pixels P2 may be electrically connected to scan lines SL each substantially extending in a first direction and data lines DL each substantially extending in a second direction. The scan lines SL and the data lines DL may detour around the second transmission areas TA2. The second detour area MA2 may accommodate detouring sections of the scan lines SL and/or the data lines DL and may be disposed between the second transmission areas TA2 and the second display area DA2.

Referring to FIG. 13C, a plurality of third transmission areas TA3 may be disposed in the third display area DA3 of the second display panel and may be spaced from one another. The third pixels P3 may be arranged around the third transmission areas TA3. Two adjacent/opposite third pixels P3 may be spaced from each other with one intervening third transmission area TA3. Some third pixels P3 may be arranged between adjacent third transmission areas TA3.

The third pixels P3 may be electrically connected to scan lines SL each substantially extending in a first direction and data lines DL each substantially extending in a second direction. The scan line SL and the data line DL may detour around the third transmission areas TA3. The third detour area MA3 may accommodate detouring sections of the scan lines SL and/or the data lines DL and may be disposed between the third transmission areas TA3 and the third display area DA3.

Figure 14:
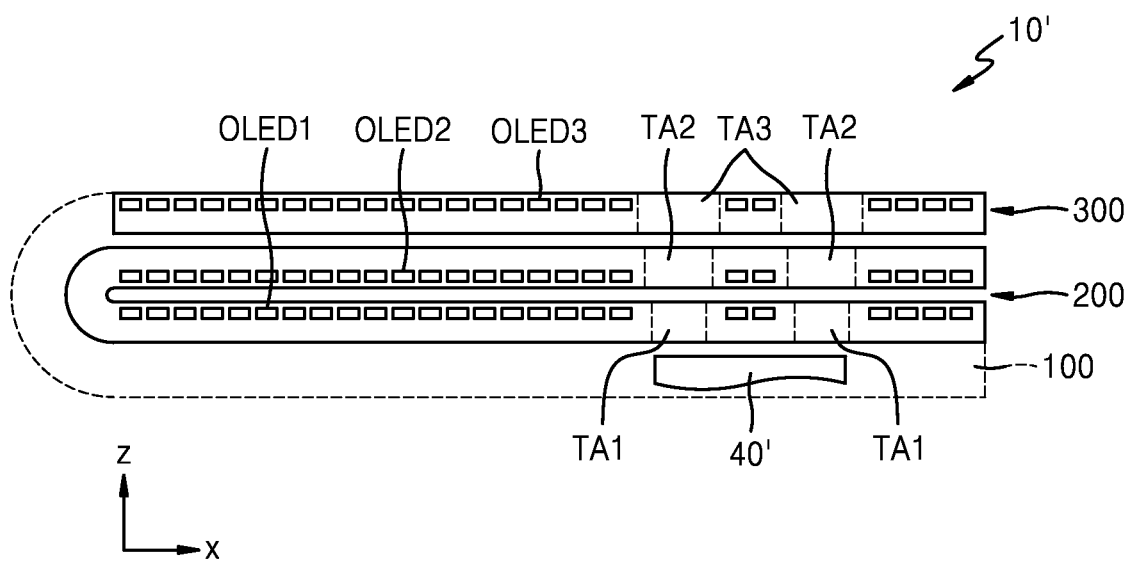
FIG. 14 is a cross-sectional view illustrating a first display panel and a second display panel when a display apparatus is in a folded state according to an embodiment.

As illustrated in FIG. 14, when a display apparatus 10' is folded, a third transmission area TA3 may overlap a corresponding second transmission area TA2 and a corresponding first transmission area TA1. In order to reduce interference of light emitted from a component 400' or proceeding to the component 400', a width W3' of the third transmission area TA3 in the x direction may be equal to or greater than a width W2' of the second transmission area TA2 in the x direction, and the width W2' of the second transmission area TA2 in the x direction may be equal to or greater than a width W1' of the first transmission area TA1 in the x direction.

The display apparatus 10' may include the first display panel 200 and the second display panel 300. The first and second display panels 200 and 300 of the display apparatus 10' may respectively have a structure of the first and the second display panels described with reference to FIGS. 6A and 6B. Alternatively, the first and second display panels 200 and 300 of the display apparatus 10' may respectively have a structure of the first and the second display panels described with reference to FIGS. 11 and 12.

Referring to FIGS. 13A, 13B, 13C, AND 14, a minimum distance between the two first transmission areas TA1 in the first direction is greater than a minimum distance between the two second transmission areas TA2 in the first direction. a minimum distance between the two second transmission areas TA2 in the first direction is greater than a minimum distance between the two third transmission areas TA3 in the first direction.

The component 400' may correspond to the transmission areas. For example, one component 400' may overlap the first transmission areas TA1, the second transmission areas TA2, and the third transmission areas TA3.

In an embodiment, the transmittance of each of the first transmission area TA1, the second transmission area TA2, and the third transmission area TA3 may be relatively less than that of each of the first through third transmission areas TA1, TA2, and TA3 of the display apparatus 10 described with reference to FIG. 6B. The component 400' may include a sensor operating with a relatively small transmittance, for example, a sensor using light of an infrared wavelength range.

Figure 15:
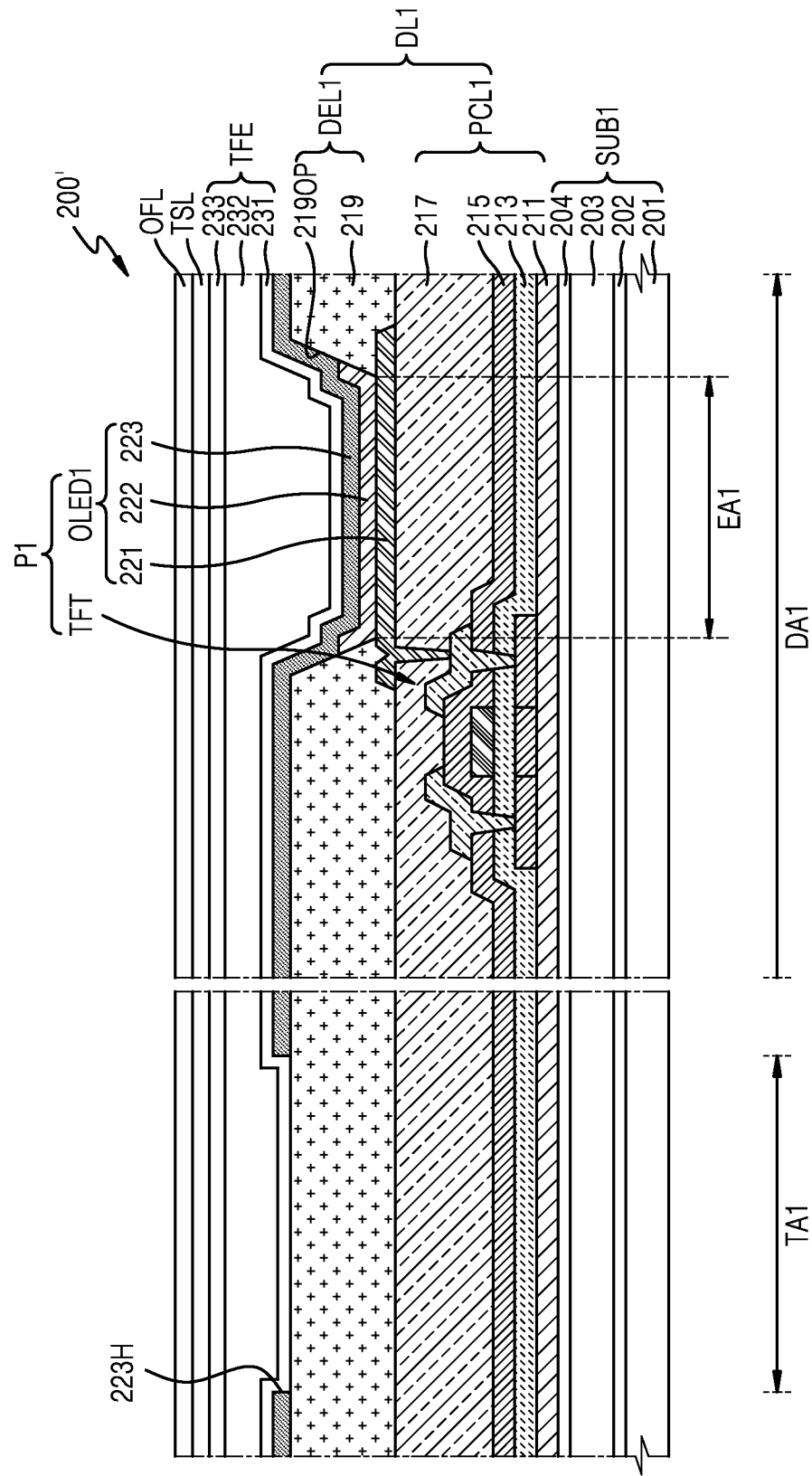
FIG. 15 is a cross-sectional view illustrating a portion of a first display panel according to an embodiment.
Figure 16:
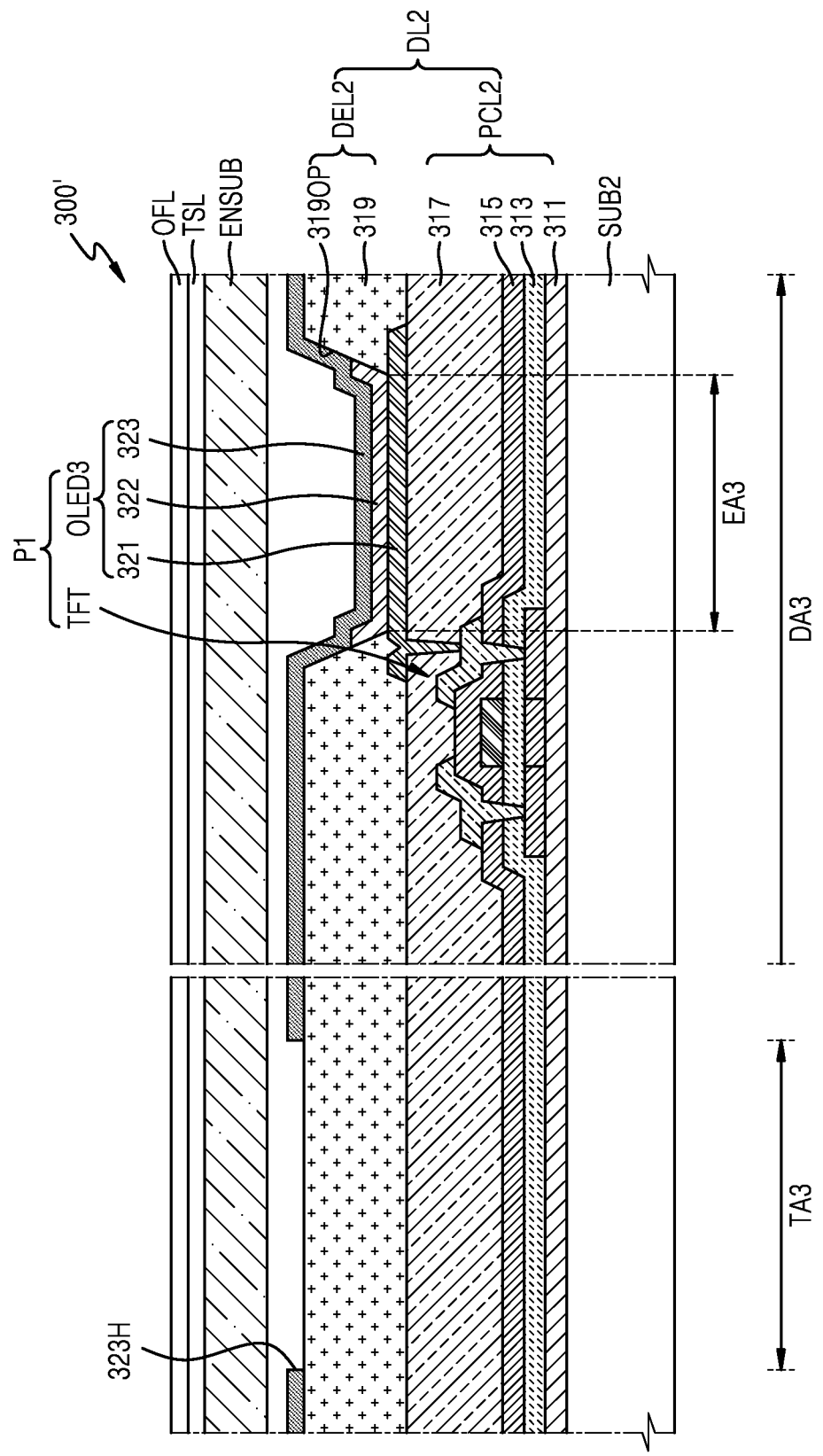
FIG. 16 is a cross-sectional view illustrating a portion of a second display panel according to an embodiment.

FIG. 15 is a cross-sectional view illustrating a portion of a first display panel 200' according to an embodiment, and FIG. 16 is a cross-sectional view illustrating a portion of a second display panel 300' according to an embodiment.

Referring to FIG. 15, the first display panel 200' may include the first substrate SUB1, the first pixel circuit layer PCL1, the first display element layer DEL1, and the thin film encapsulation layer TFE. The first organic light-emitting diode OLED1 of the first display element layer DEL1 may be located in the first display area DA1, and no first organic light-emitting diode OLED1 may be located in the first transmission area TA1. A stacked structure of the first display area DA1 of FIG. 15 is the same as the stacked structure of the components corresponding to the first pixel P1 described above with reference to FIG. 9.

Referring to the first transmission area TA1 of FIG. 15, no pixel electrode 221 may be disposed in the first transmission area TA1, and the common electrode 223 may include a hole 223H located in the first transmission area TA1. In contrast, the first substrate SUB1, the first pixel circuit layer PCL1, and the thin film encapsulation layer TFE may continuously extend across the first transmission area TA1 and may include no holes in the first transmission area TA1.

FIG. 15 illustrates that insulating layers included in the first pixel circuit layer PCL1 are continuously formed across the first transmission area TA1 and the first display area DA1. According to an embodiment, some of the layers included in the first pixel circuit layer PCL1, for example, one or more of the first buffer layer 211, the first gate insulating layer 213, the first interlayer insulating layer 215, and the first planarization insulating layer 217, may include a hole located in the first transmission area TA1.

One or more of the structures described with reference to FIG. 15 may be applied to the second transmission area TA2.

Referring to FIG. 16, the second display panel 300' may include the second substrate SUB2, the second pixel circuit layer PCL2, the second display element layer DEL2, and the encapsulation substrate ENSUB. The third organic light-emitting diode OLED3 of the second display element layer DEL2 may be located in the third display area DA3, and no third organic light-emitting diode OLED3 may be located in the third transmission area TA3. A stacked structure of the third display area DA3 of FIG. 16 is the same as the stacked structure of the components corresponding to the third pixel P3 described above with reference to FIG. 10.

Referring to the third transmission area TA3 of FIG. 16, no pixel electrode 321 may be disposed in the third transmission area TA3, and the common electrode 323 may have a hole 323H located in the third transmission area TA3.

In contrast, the second substrate SUB2, the second pixel circuit layer PCL2, and the encapsulation substrate ENSUB may continuously extend across the third transmission area TA3 and may include no holes in the third transmission area TA3.

FIG. 16 illustrates that the insulating layers included in the second pixel circuit layer PCL2 are continuously formed across the third transmission area TA3 and the third display area DA3. According to an embodiment, some of the layers included in the second pixel circuit layer PCL2, for example, one or more of the second buffer layer 311, the second gate insulating layer 313, the second interlayer insulating layer 315, and the second planarization insulating layer 317, may include a hole located in the third transmission area TA3.

Figure 17:
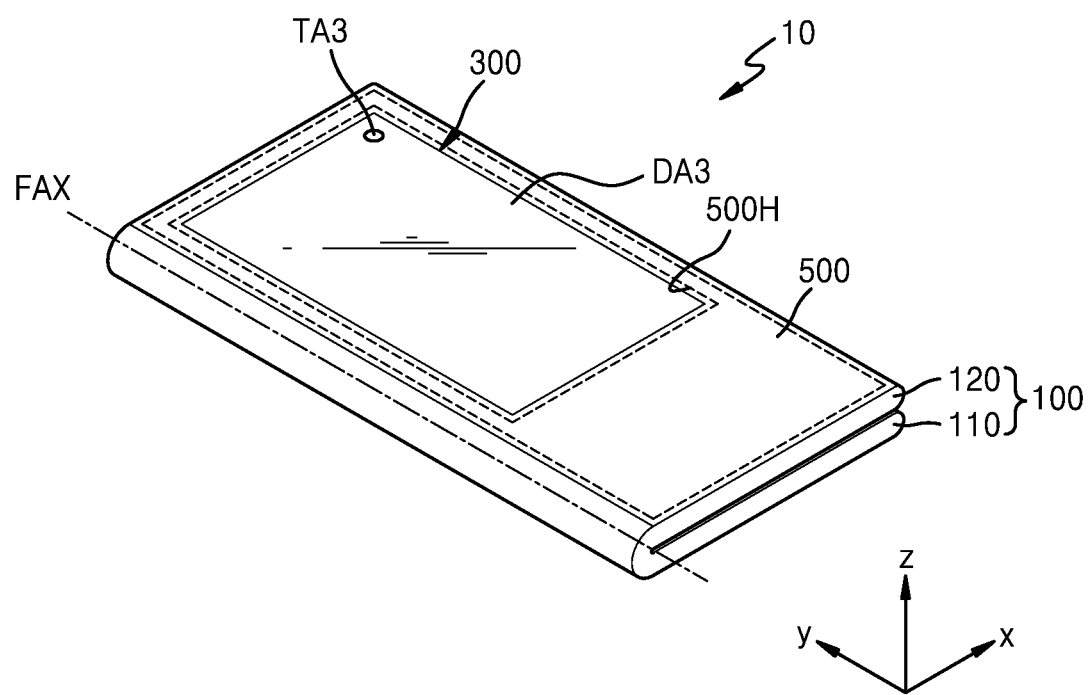
FIG. 17 is a perspective view schematically illustrating a display apparatus according to an embodiment.

FIG. 17 is a perspective view schematically illustrating the display apparatus 10 according to an embodiment.

Referring to FIG. 17, the display apparatus 10 may include a circuit portion 500 including an electrical circuit and disposed outside the second display panel 300. For example, the circuit portion 500 may have a hole 500H, and the second display panel 300 may be located in the hole 500H. The circuit portion 500 may be covered by the case 100. Therefore, FIG. 17 illustrates the circuit portion 500 using broken lines.

The circuit portion 500 may be electrically connected to each of the first display panel 200 (refer to FIG. 1) and the second display panel 300 and may provide certain signals (for example, a scan signal, a data signal, and a control signal) and/or certain voltages to the first display panel 200 and the second display panel 300. The circuit portion 500 may include devices and wires for providing the described signals or voltages. The devices and wires may be arranged on a flexible printed circuit board (FPCB) included in the circuit portion 500.

Figure 18:
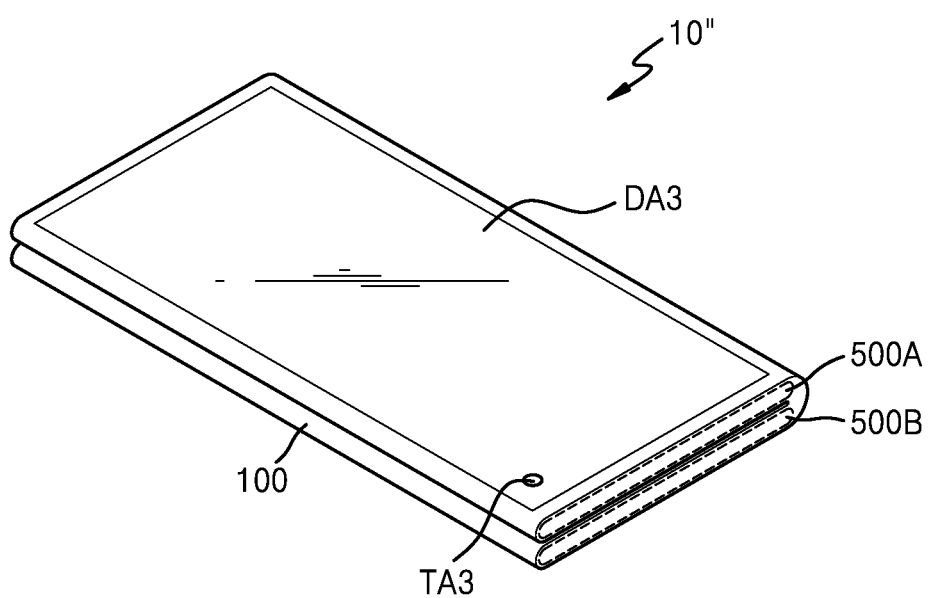
FIG. 18 is a perspective view schematically illustrating a display apparatus according to an embodiment.

FIG. 18 is a perspective view schematically illustrating a display apparatus 10" according to an embodiment.

Referring to FIG. 18, a second display panel of the display apparatus 10" may have the third display area DA3 having a relatively larger area than the third display area DA3 of the display apparatus 10 described with reference to FIG. 17. A circuit portion may be located at a side surface of the display apparatus 10". For example, a first circuit portion 500A and a second circuit portion 500B may be located at the side surface of the display apparatus 10". The first circuit portion 500A and the second circuit portion 500B may be electrically connected to the first display panel and the second display panel, respectively. According to an embodiment, the display apparatus 10" may include one of the first circuit portion 500A and the second circuit portion 500B, and the one of the first circuit portion 500A and the second circuit portion 500B may be electrically connected to each of the first display panel and the second display panel.

According to embodiments, the spatial use of the display areas of a display apparatus may be optimized.

The described embodiments should be considered in an illustrative sense and not for purposes of limitation. Descriptions of features or aspects associated with one embodiment may be applicable to in other embodiments. While example embodiments have been described with reference to the figures, various changes in form and details may be made without departing from the scope defined by the following claims.

What is claimed is:

1. A foldable display apparatus comprising:
a first display panel comprising a first display section and a second display section, wherein the first display section comprises a first pixel set and a first transmission structure surrounded by the first pixel set, wherein the second display section comprises a second pixel set, comprises a second transmission structure surrounded by the second pixel set, and is configured to rotate relative to the first display section about a folding axis, and wherein a distance from the folding axis to a center of the first transmission structure is substantially equal to a distance from the folding axis to a center of the second transmission structure; and
a component overlapping the first transmission structure, wherein the second transmission structure is configured to overlap the first transmission structure and the component for transmitting a signal between the component and an external entity when the foldable display apparatus is in a folded state.

2. The foldable display apparatus of claim 1, wherein a width of the second transmission structure in a first direction is equal to or greater than a width of the first transmission structure in the first direction, and wherein the first direction is parallel to a display surface of the first display panel.

3. The foldable display apparatus of claim 2, further comprising a second display panel overlapping the first display panel, wherein the first display panel is configured to display a first image in a first display direction, and wherein the second display panel is configured to display a second image in a second display direction different from the first display direction.

4. The foldable display apparatus of claim 3, wherein the second display panel includes a third transmission structure overlapping the second transmission structure, and wherein a width of the third transmission structure in the first direction is equal to or greater than the width of the second transmission structure in the first direction.

5. The foldable display apparatus of claim 4, wherein the second display panel further includes a third pixel set, and wherein the third transmission structure is surrounded by the third pixel set.

6. The foldable display apparatus of claim 3, further comprising a circuit disposed outside the second display panel and electrically connected to each of the first display panel and the second display panel.

7. The foldable display apparatus of claim 1, wherein the first transmission structure comprises a first hole that extends through layers of the first display panel, and wherein the second transmission structure comprises a second hole that extends through the layers of the first display panel.

8. The foldable display apparatus of claim 1, wherein the first display panel comprises:
a first substrate;
a pixel circuit layer disposed on the first substrate and comprising transistors and storage capacitors;
a display element layer disposed on the pixel circuit layer and comprising display elements, wherein some elements of the pixel circuit layer and some elements of the display element layer form the first pixel set and the second pixel set; and
a thin film encapsulation layer disposed on the display element layer.

9. The foldable display apparatus of claim 8,
wherein the display element layer comprises pixel electrodes corresponding to the display elements, respectively, comprises emission layers corresponding to the pixel electrodes, respectively, and comprises a common electrode on the emission layers, and
wherein the common electrode has a first hole and a second hole located in the first transmission structure and the second transmission structure, respectively.

10. The foldable display apparatus of claim 1, wherein the component comprises at least one of a camera, a sensor, a speaker, a microphone, or a lamp.

11. The foldable display apparatus of claim 1, wherein the first display panel is flexible, and wherein the first display section is directly connected to the second display section.

12. The foldable display apparatus of claim 1, wherein a perimeter of the second transmission structure surrounds a perimeter of the first transmission structure in a plan view of the foldable display apparatus when the foldable display apparatus is in the folded state.

13. The foldable display apparatus of claim 1, wherein the first display section further comprises a touch electrode layer and an optical functional layer, wherein the touch electrode layer comprises touch electrode and is covered by the optical function layer, and wherein the first transmission structure comprises a hole positioned at one or more of the optical function layer and the touch electrode layer.

14. The foldable display apparatus of claim 1, further comprising a second display panel smaller than the first display panel and partially overlapping the first display panel.

15. The foldable display apparatus of claim 14, wherein the second display section is positioned closer to the second display panel than the first display section.

16. The foldable display apparatus of claim 14,
wherein the second display panel includes a third pixel set, two third transmission structures surrounded by the third pixel set, and a fourth pixel set positioned between the two third transmission structures, and
wherein one of the two third transmission structures overlaps the second transmission structure.

17. The foldable display apparatus of claim 16, wherein when the foldable display apparatus is in the folded state, the one of the two third transmission structures overlaps each of the second transmission structure, the first transmission structure, and the component.

18. The foldable display apparatus of claim 1,
wherein the first transmission structure comprises two first transmission sub-structures,
wherein the first display section further comprises a third pixel set positioned between the two first transmission sub-structures,
wherein the second transmission structure comprises two second transmission sub-structures, and
wherein the second display section further comprises a fourth pixel set positioned between the two second transmission sub-structures.

19. The foldable display apparatus of claim 18, wherein when the foldable display apparatus is in the folded state, the component overlaps perimeters of the two first transmission sub-structures, perimeters of the two second transmission sub-structures, the third pixel set, and the fourth pixel set.

20. The foldable display apparatus of claim 18, wherein a minimum distance between the two first transmission sub-structures in the first direction is greater than a minimum distance between the two second transmission sub-structures in the first direction.

* * * * *